United States Patent [19]
Chen et al.

[11] Patent Number: 6,115,046
[45] Date of Patent: Sep. 5, 2000

[54] METHOD AND APPARATUS FOR GENERATING THREE DIMENSIONAL DRAWING ON A GRAPHICS DISPLAY

[75] Inventors: Liangpin Chen, Monterey Park; Xingzhang Frank Niu, Rosemead, both of Calif.

[73] Assignee: International Business Machines Corporation, Armonk, N.Y.

[21] Appl. No.: 08/368,239

[22] Filed: Jan. 3, 1995

Related U.S. Application Data

[63] Continuation of application No. 08/149,141, Nov. 3, 1993, abandoned, which is a continuation of application No. 07/618,187, Nov. 26, 1990, abandoned.

[51] Int. Cl.$^7$ ................................................ G06T 17/40
[52] U.S. Cl. .................................... 345/420; 345/433
[58] Field of Search .................................... 395/119, 120, 395/125, 128, 129, 138, 139; 364/474.24; 345/419, 420, 425, 428, 429, 438, 439, 433

[56] References Cited

U.S. PATENT DOCUMENTS

| | | | |
|---|---|---|---|
| 4,684,990 | 8/1987 | Oxley ........................................ | 358/183 |
| 4,809,065 | 2/1989 | Harris et al. ............................. | 358/88 |
| 4,845,651 | 7/1989 | Aizawa et al. ........................... | 382/44 |
| 4,849,913 | 7/1989 | Ward et al. .............................. | 364/468 |
| 4,912,664 | 3/1990 | Weiss et al. ............................. | 364/577 |
| 4,962,472 | 10/1990 | Seki et al. ............................... | 364/900 |
| 5,003,498 | 3/1991 | Ota et al. ................................. | 395/120 |
| 5,103,217 | 4/1992 | Cawley .................................... | 395/129 |
| 5,124,693 | 6/1992 | Himelstein et al. ..................... | 395/119 |
| 5,265,197 | 11/1993 | Kondo ..................................... | 395/120 |

OTHER PUBLICATIONS

J.E. Fuller, "Using Autocad," 1989, 19–3, 19–14.

*Primary Examiner*—Mark K. Zimmerman
*Attorney, Agent, or Firm*—G. Marlin Knight; Felsman, Bradley, Vaden, Gunter & Dillon, LLP

[57] ABSTRACT

A design system for designing, dynamically changing and displaying design drawings. The invention allows a user to select a solid object from a display as the current, active object. The user then selects a first, parent face by selecting any point on a face of the solid object. Next, the user is prompted to select another point on a line of another face parallel to the first face. This operation defines the first offset face which is a variable distance from the first parent face. Subsequently, the user selects a point on a line to define a second parent face of the solid object. Then, the user selects a point on a line parallel to the second parent face. This defines the offset face and a corresponding distance between the two faces which is a fixed value. Finally, the user is prompted to enter a new distance between the first parent face and the first offset face. This new value is used to generate a new solid based on a change to the variable distance between the first two faces and a corresponding shift in the location of the fixed distance between the second pair of faces and a resulting modification of the surface.

22 Claims, 13 Drawing Sheets

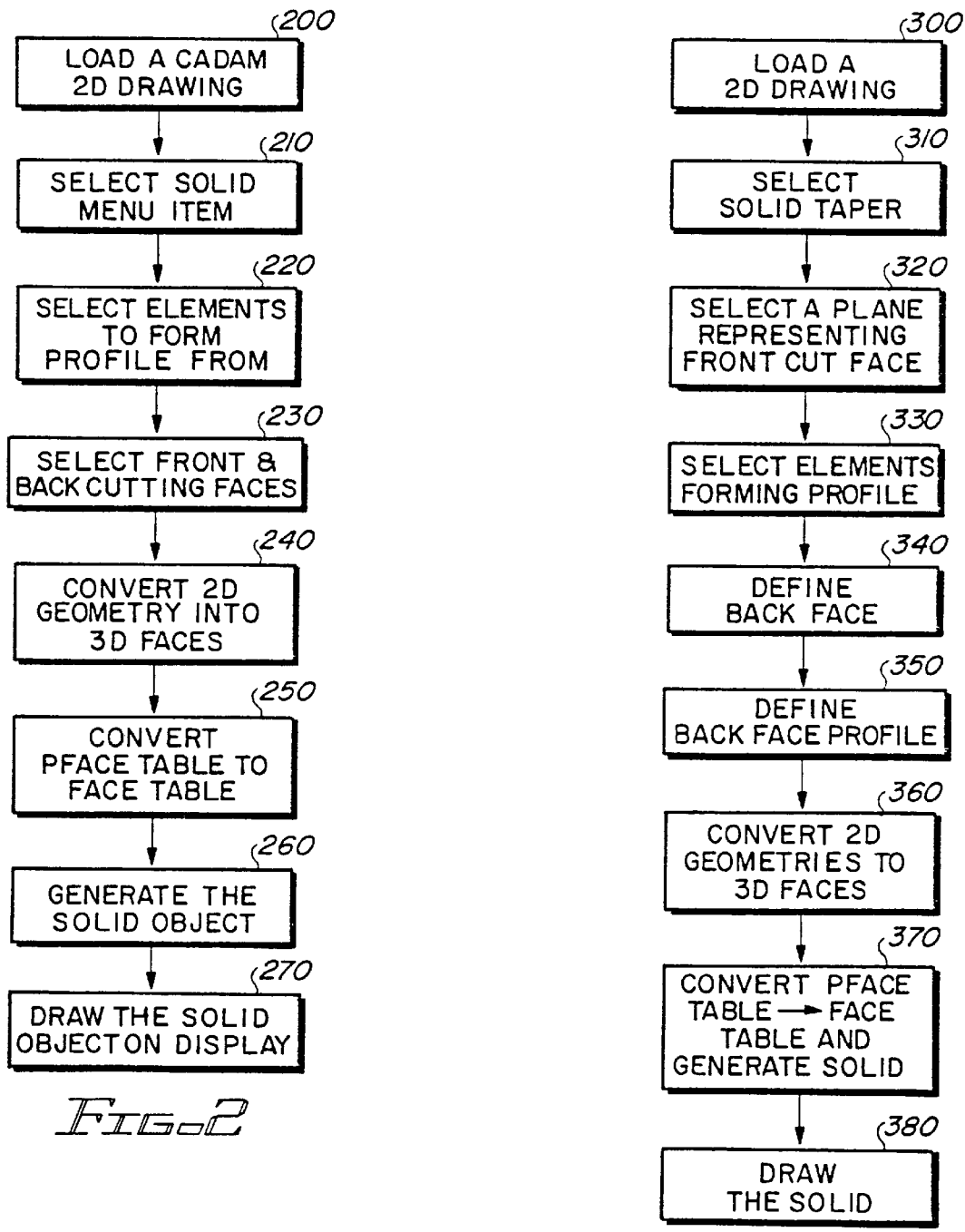

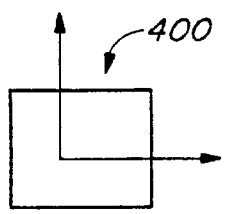
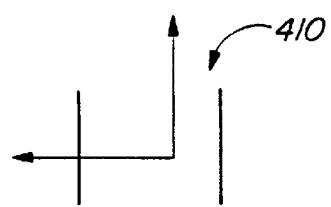
FIG. 4A        FIG. 4B
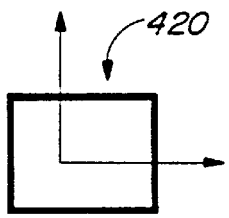
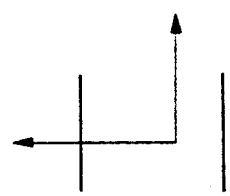
FIG. 4C        FIG. 4D
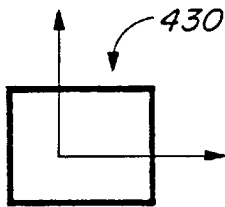
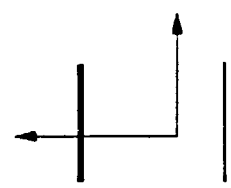
FIG. 4E        FIG. 4F
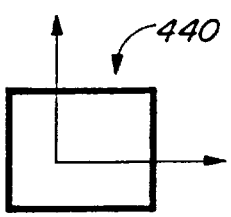
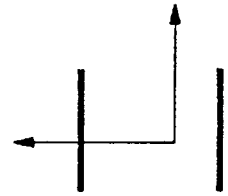
FIG. 4G        FIG. 4H
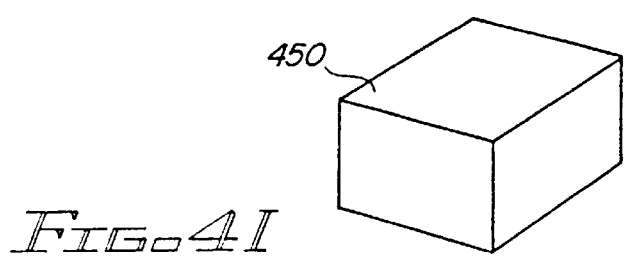
FIG. 4I

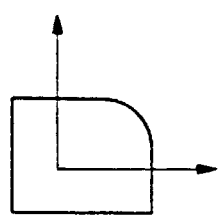
FIG. 5A
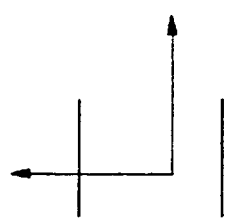
FIG. 5B
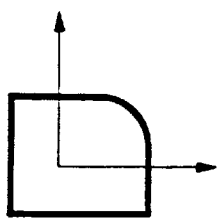
FIG. 5C
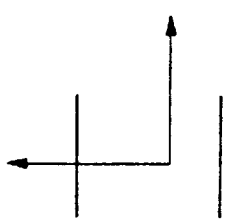
FIG. 5D
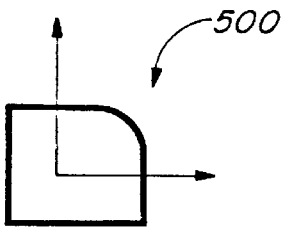
FIG. 5E
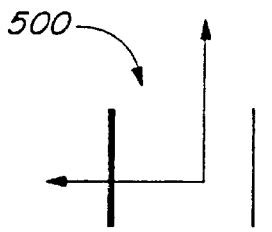
FIG. 5F
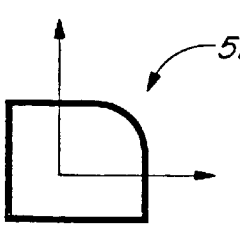
FIG. 5G
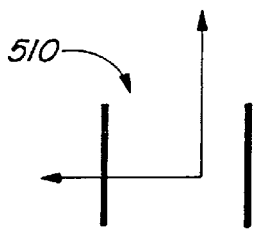
FIG. 5H
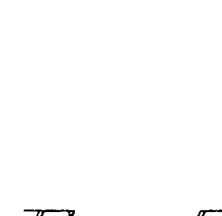
FIG. 5I
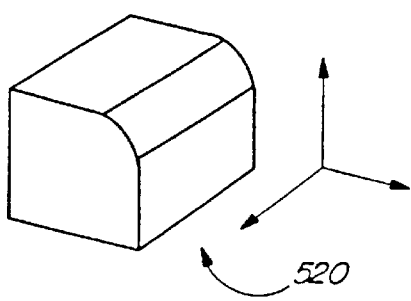

SELECT FRONT FACE

SELECT PROFILE ON FRONT FACE

SELECT BACK FACE

SELECT PROFILE ON BACK FACE

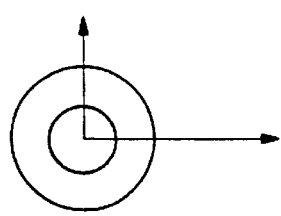
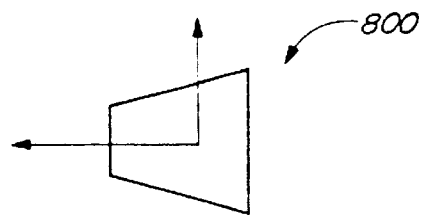
FIG. 8A    FIG. 8B
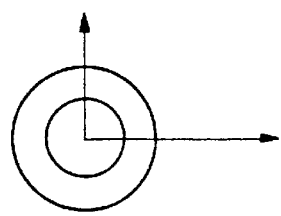
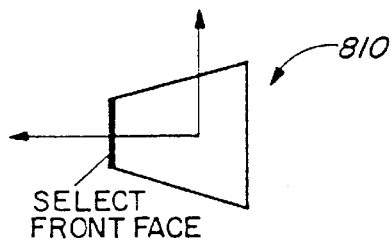
FIG. 8C    FIG. 8D
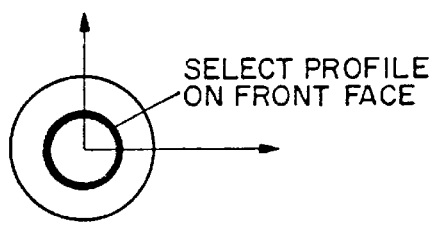
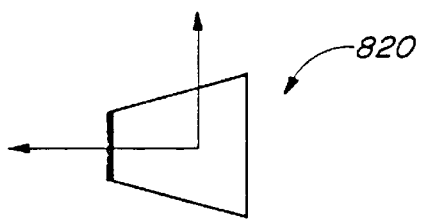
FIG. 8E    FIG. 8F
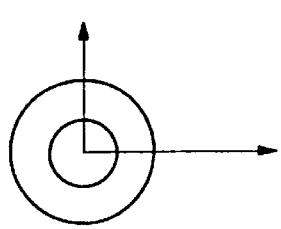
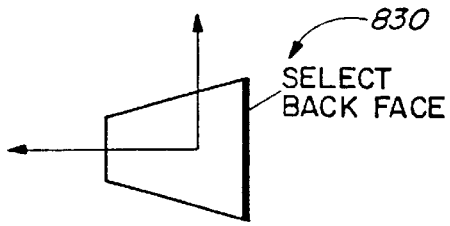
FIG. 8G    FIG. 8H
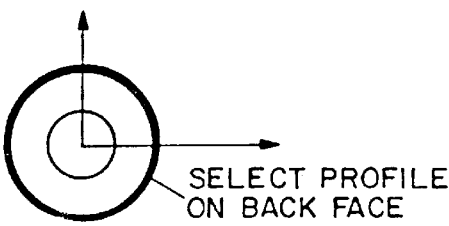
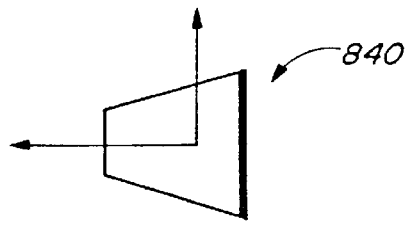
FIG. 8I    FIG. 8J

| SOLID FUNCTION: PARAMETRIC MODIFICATION | |
|---|---|
| PARAMETER FUNCTION MENU OPTIONS | |
| Def Parent   Def Offset   Chg Parm   Show All   Noshow | |
| MENU OPTIONS | FUNCTION |
| Def Parent | DEFINES A PLANE OF THE SOLID AS A PARENT PLANE. MUST BE PAIRED WITH A PARALLEL OFFSET PLANE WHOSE DISTANCE BETWEEN THE TWO PLANES IS THE DISTANCE YOU WANT TO MODIFY. |
| Def Offset | DEFINES A PLANE OF THE SOLID PARALLEL TO THE PARENT PLANE AS AN OFFSET PLANE. MUST BE PAIRED WITH A PARALLEL DATUM PLANE FOR PARAMETRIC MODIFICATION. |
| Chg Parm | DISPLAYS THE DISTANCE VALUE BETWEEN PAIRS OF PARENT AND OFFSET PLANES. |
| Show All | DISPLAYS ALL NOSHOWN PLANES OF THE CURRENT SOLID. |
| Noshow | TEMPORARILY SUPPRESSES THE DISPLAY OF A SELECTED PLANE OF THE CURRENT SOLID SO THAT THE HIDDEN PLANE CAN BE SELECTED. |

Fig. 11

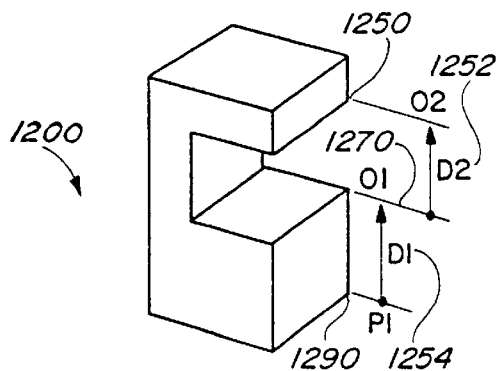
Fig. 12A
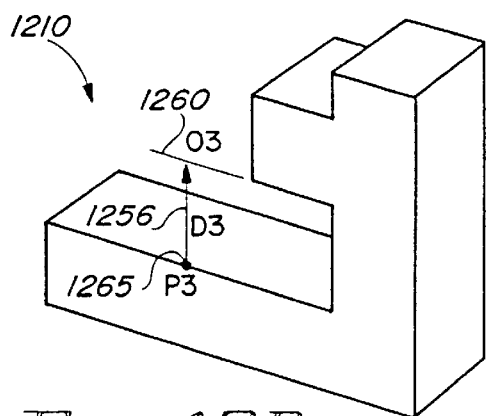
Fig. 12B
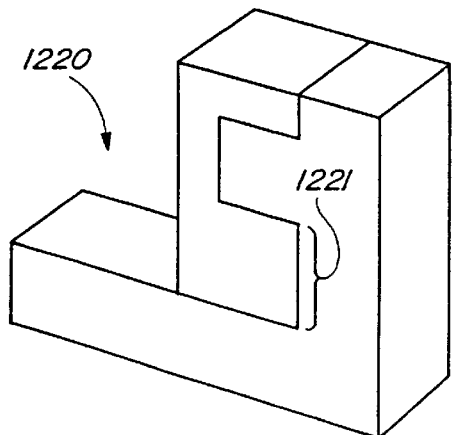
Fig. 12C
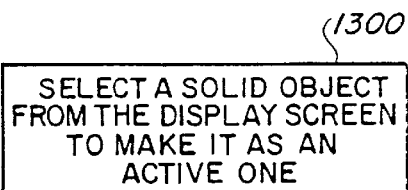
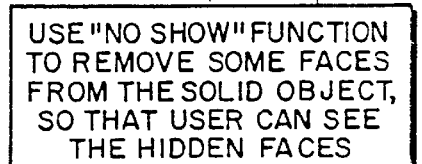
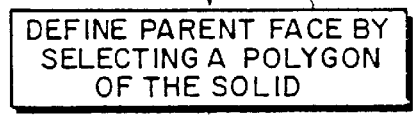
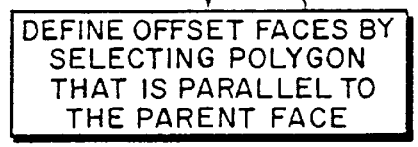
Fig. 13
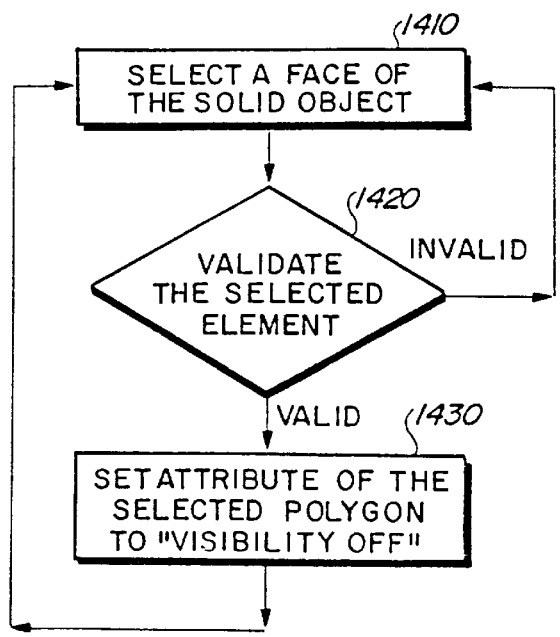
Fig. 14

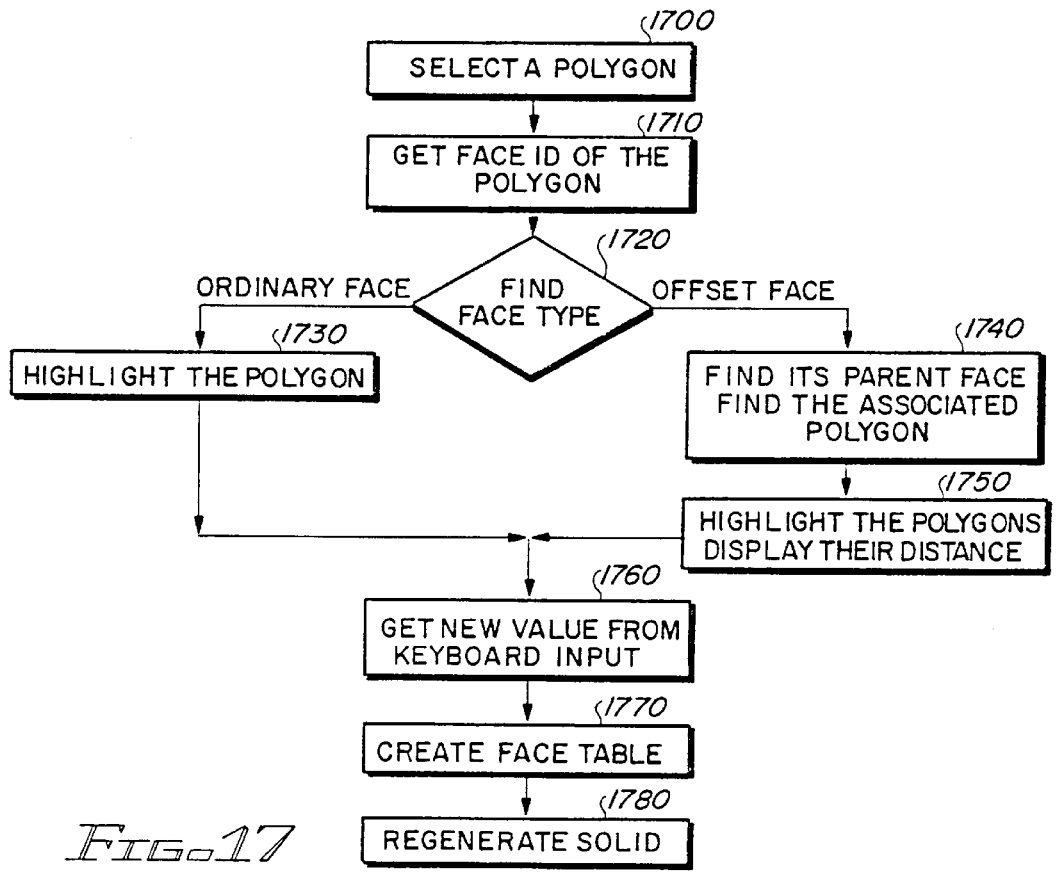
Fig. 17
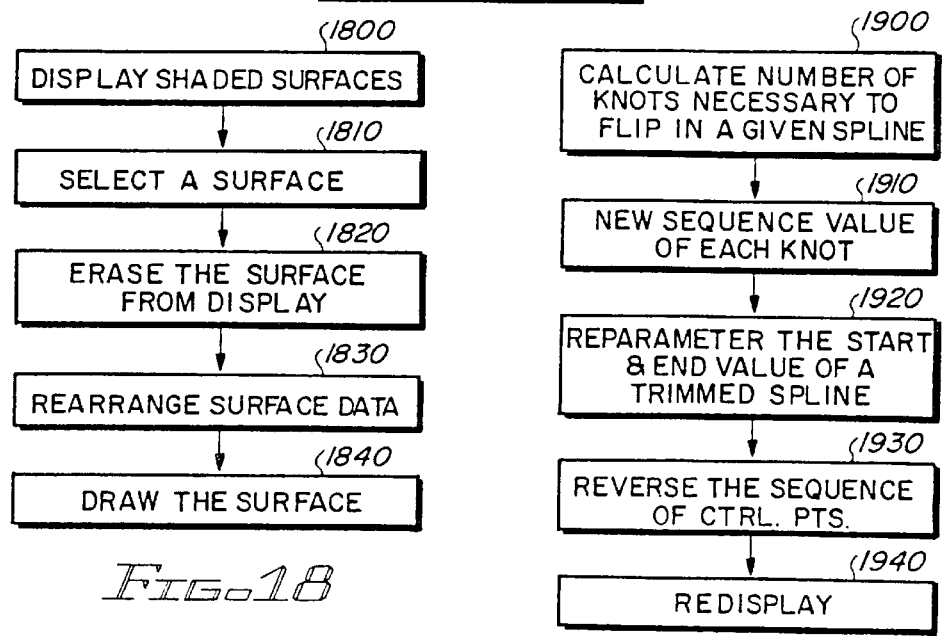
Fig. 18
Fig. 19

METHOD AND APPARATUS FOR GENERATING THREE DIMENSIONAL DRAWING ON A GRAPHICS DISPLAY

This is a continuation, of application Ser. No. 08/149,141 filed Nov. 3, 1993, now abandoned.

This is a continuation, of application Ser. No. 07/618,187, filed Nov. 26, 1990, now abandoned.

BACKGROUND OF THE INVENTION

In CAD applications, it is important to be able to transform two-dimensional representations of objects into solid representations. The automobile and aircraft industries were two of the first to exploit this function for mechanical assemblies. Examples of general CAD systems are disclosed in U.S. Pat. Nos. 4,962,472; 4,849,913; and 4,912,664.

U.S. Pat. No. 4,849,913 discloses a method for the design and construction of composite parts by logically determining the geometric definitions for each ply contained in the composite part. This information can be used by subsequent analysis routines to determine the optimal method for manufacturing the part. Thus, the physical relationship of each of the parts and their correlating features are available for use by the system. However, the CAD system does not have any ability to dynamically alter the dimensions of a solid based on a change in distance between a plurality of faces.

A face is used to refer to an unbounded plane. Unbounded refers to the fact that no limits are placed on the plane dimensions. A loop is a bounded area of a face. Boundary elements comprise the loop. For example, the four lines forming the edge of the plane are boundary elements. A Vertex is an endpoint of an edge. Vertices are calculated by finding the intersection of three (3) intersecting plane equations. A loop table contains information defining all the loops contained in the solid object.

The subject invention overcomes the need to pre-program relationships between CAD geometries and allows a user to dynamically alter a solid geometry on the basis of changes made in a face.

SUMMARY OF THE INVENTION

It is thus an object of this invention to provide an improved apparatus and method for designing, dynamically changing and displaying three dimensional solid representations.

The invention allows a user to select a solid object from a display as the current, active object. The user then selects a first, parent face by selecting any point on a face of the solid object. Next, the user is prompted to select another point on another face parallel to the first face. This operation defines the first offset face which is a variable distance from the first parent face.

Subsequently, the user selects a point on the first offset face to redefine it as a second parent face of the solid object. Then, the user selects a point on a face parallel to the second parent face. This defines a nested relation between two parent/offset pairs which are parallel to each other.

Finally, the user is prompted to enter a new distance between the first parent face and the first offset face. This new value is used to generate a new solid based on a change to the variable distance between the first two faces and a corresponding shift in the location of the fixed distance between the second pair of faces and a resulting modification of the solid.

BRIEF DESCRIPTION OF THE DRAWINGS

FIG. 2 is a flow chart of the solid logic in accordance with the present invention;

FIG. 3 is a flow chart of the solid logic for a tapered solid in accordance with the present invention;

FIG. 4 is an illustration of the steps used to generate an extruded solid in accordance with the present invention;

FIG. 5 is an illustration of the steps used to generate an extruded solid in accordance with the present invention;

FIG. 8 is an illustration of a set of steps used to generate a tapered solid in accordance with the present invention;

FIG. 11 is an illustration of the parameter function menu options in accordance with the present invention;

FIG. 12 is an illustration of correlating parametric entities in accordance with the present invention;

FIG. 13 is a flowchart describing the logic of defining relationships between the faces of a solid object in accordance with the subject invention;

FIG. 14 is a flowchart describing the logic of the No Show function in accordance with the subject invention;

FIG. 17 is a flowchart of the logic implementing the Change Parameter function in accordance with the subject invention;

FIG. 18 is a flowchart depicting the logic of the shading surface normal in accordance with the subject invention;

FIG. 19 is a flowchart depicting the logic of the rearranging surface data in accordance with the subject invention;

DETAILED DESCRIPTION OF THE INVENTION

Figure 1:
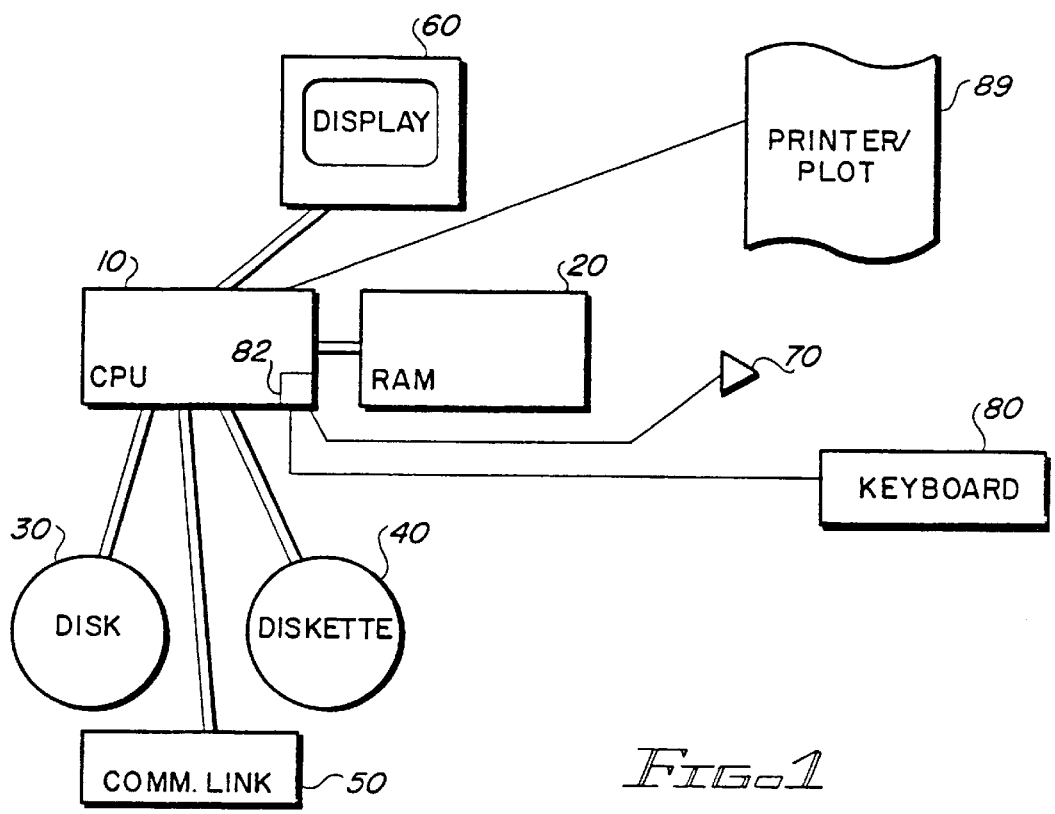
FIG. 1 is a block diagram of a computer in accordance with the present invention.
Figures 7, 8K:
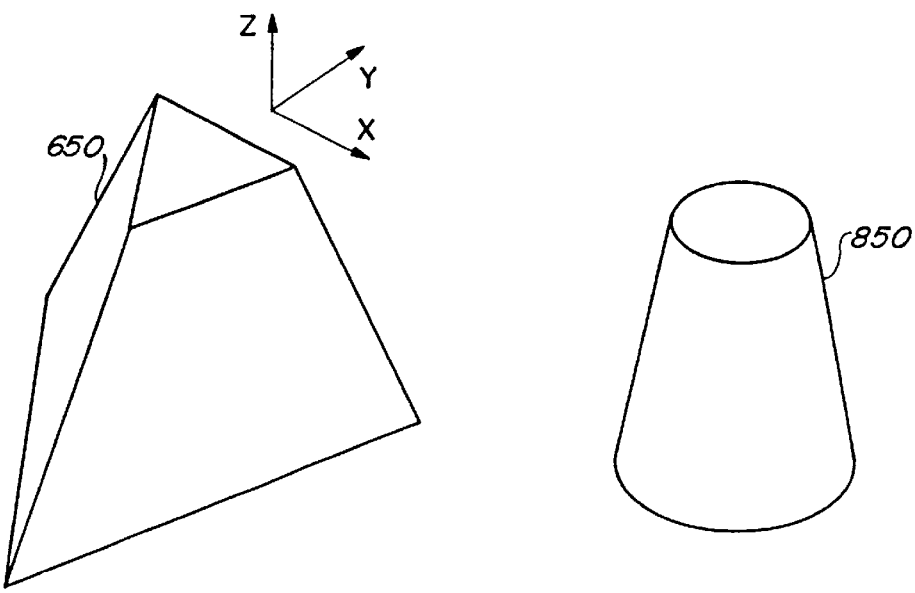
FIG. 7 is an illustration of a step used to generate a tapered solid in accordance with the present invention.
Figure 6A:
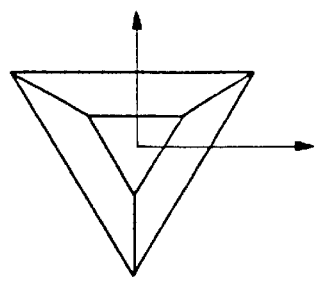
FIG. 6 is an illustration of the steps used to generate a tapered solid in accordance with the present invention.
Figure 6B:
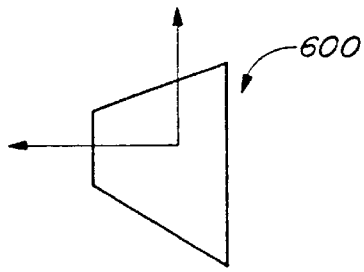
Figure 6C:
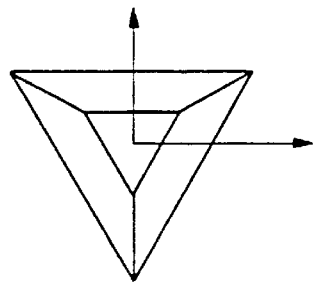
Figure 6D:
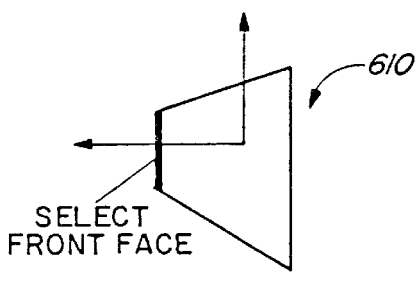
Figure 6E:
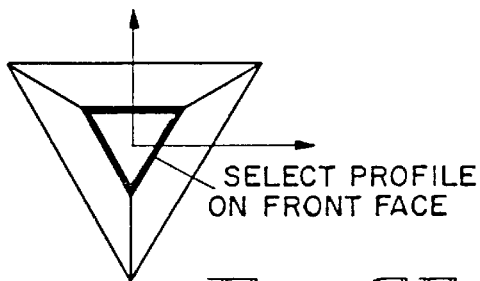
Figure 6F:
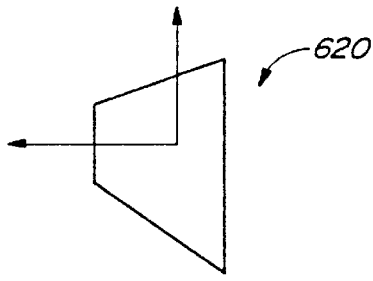
Figure 6G:
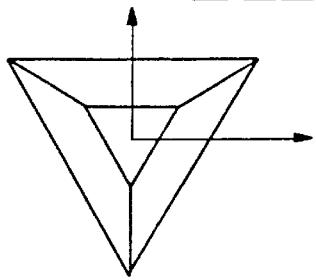
Figure 6H:
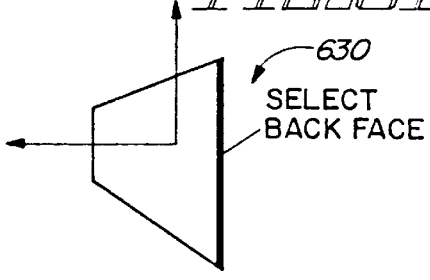
Figure 6I:
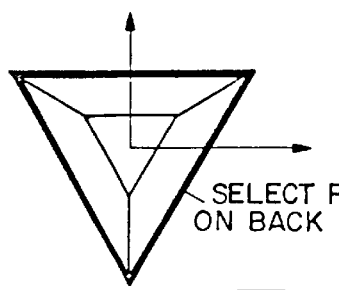
Figure 6J:
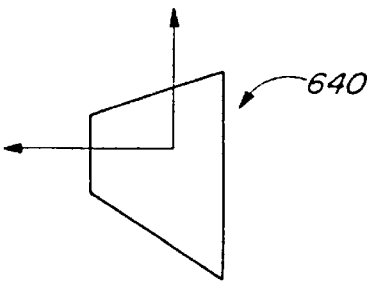

With reference to FIG. 1, the apparatus of the subject invention is a standard microprocessor such as that marketed by IBM under the product name of PS/2. The CPU 10 can be an 80386 or 80486 processor for example. The CPU 10 has Direct Memory Access (DMA) to the RAM 20, Disk 30 and Diskette 40. The CPU 10 can also transmit information via the Communication Link 50.

The CPU 10 also communicates to an attached graphic display to display information in EGA, VGA or other higher resolution modes. A mouse 70 is an optional cursor pointing device that is used to supplement the arrow keys of the keyboard 80 for specifying precise paintings on the graphic display 60. The keyboard is controlled by a keyboard adapter 82, including buffer means, in the CPU 10. Finally, a printer or plotter 89 can be attached to the CPU 10 to generate hardcopy of drawings.

The software used to awake the unique hardware features of this invention resides on the Disk 30 as do the drawings generated by a designer employing the invention. The software is also responsible for translating signals from the mouse/keyboard into appropriate system actions.

FIG. 2 is a flowchart representing the logic in accordance with the invention. To generate a solid from a two dimensional drawing, the drawing is first loaded into the computer memory as shown in function block 200. The drawing should contain multiple two dimensional views of an object. The user then selects the appropriate menu selection item as depicted in input block 210. Then, the user selects elements to form a profile for the extrusion operation as depicted in input block 220. The elements are lines and circles on the two dimensional views from which to generate the solid model. The pointers to the selected elements are stored in the data structure set forth in Appendix 1.

The geometric elements are selected in a clockwise or counter-clockwise sequence. When all of the necessary elements have been selected, then menu item END is selected to indicate completion. The data structure is used to store this information in a manageable fashion for further processing in accordance with the subject invention.

The user selects front and back cutting faces by selecting lines in the views other than the profile view as depicted in input block 230. Next, the selected two dimensional elements are converted into three dimensional geometries as set forth in input block 240. So, for example, a line becomes an unbounded plane, a circle becomes an unbounded cylinder, and a spline becomes a ruled face. The faces are stored in the PFace data structure set forth in Appendix 2.

A Face Table is a list of faces that form the boundary of a solid. The Face Table contains plane, cylinders and free form surface information. The Face Table serves as an interface between parametric design and the solid modeler. A PFace Table is a particular face table used for parametric design. It contains parameterized faces, a parameter table and a construction list for building a solid from the faces. A construction list contains a description of how each part of the solid is created and what faces are used to form the component.

The next step, in block 250, converts the PFace data structure to a Face data structure for input into the solid modeler. The Face data structure is set forth in Appendix 3.

Then, the Face data structure is input into the solid modeler to perform the extrusion taper operation as illustrated in function block 260. The data structure set forth in Appendix 4 is used in the performance of this task.

Finally, the solid object is displayed on the graphics display as shown in output block 270. The listing set forth in Appendix 5 is the source code used to implement the various transformations and display of graphic information.

An alternative embodiment of the invention allows a tapered display of a solid object to be created. The logic implementing this function is set forth in FIG. 3. The initial steps set forth in function block 300 are identical to the solid generation discussed above. A two dimensional drawing is loaded. The user selects the solid taper menu function in input block 310. Then, the user is prompted to select a plane representing the front cut face as shown in input block 320. This is done by positioning the cursor on lines other than the profile view. Next, the user is prompted to select elements forming a profile of the front face as shown in input block 330. The user selects the necessary two dimensional geometries in the profile view to form a profile for taper. Then the end menu is selected to indicate completion of profile processing.

Input block 340 depicts the user selection of the back face as the next step. The user selects lines in views other than the profile view to form a profile for the taper operation as shown in input block 350. When the selection process is complete, the end menu item is selected. Then, in function block 360, the two dimensional geometries are converted to three dimensional faces as depicted in function block 370 and a solid representation is generated. This processing includes conversion of the two dimensional geometries to three dimensional geometries and the corresponding conversion of data structures as discussed above. Finally, the solid is displayed as depicted in output block 380. The data structure set forth in Appendix 6 is used to store the solid object for subsequent display.

In FIGS. 4, 5, 6, 7 and 8, examples of solid generations employing the subject invention are illustrated. In FIG. 4, a front view and a side view of a two dimensional object are presented at label 400 and 410. To generate a solid rendition of the two, two dimensional views, the user initially selects the four lines as the profile for extrusion on the front face at label 420. Next, the back face is selected from the side view as indicated at label 430, and finally, four lines of the back face are selected to form the profile as shown at label 440. This information is used to generate a three dimensional solid object as illustrated at label 450.

FIG. 5 is another example of an extrusion. First, three lines and an arc are selected as a profile for extrusion as depicted at label 500. Then, two two lines from a side view are selected to complete the operation as shown at label 510. The solid object is then generated as shown at label 520.

FIG. 6 is another illustration of a solid generation. Again, two, two dimensional drawings are initially loaded and displayed as illustrated at label 600. Then, the front face of one of the two dimensional drawings is selected as shown at label 610. The profile for the front face is selected next as depicted at label 620. Next, a back face is selected as shown at label 630. Finally, the profile for the back face is selected as illustrated at label 640, and the three dimensional solid is generated as illustrated at label 650 in FIG. 7.

FIG. 8 illustrates a circular extrusion. Two views of the object are initially drawn as illustrated at label 800. Then, a front face is selected as noted at label 810. Next, the front face profile is selected as illustrated at label 820. Finally, the back face is selected at label 830, and the profile of the back face is also selected as illustrated at label 840. The resultant solid is displayed as shown at label 850.

Figure 9:
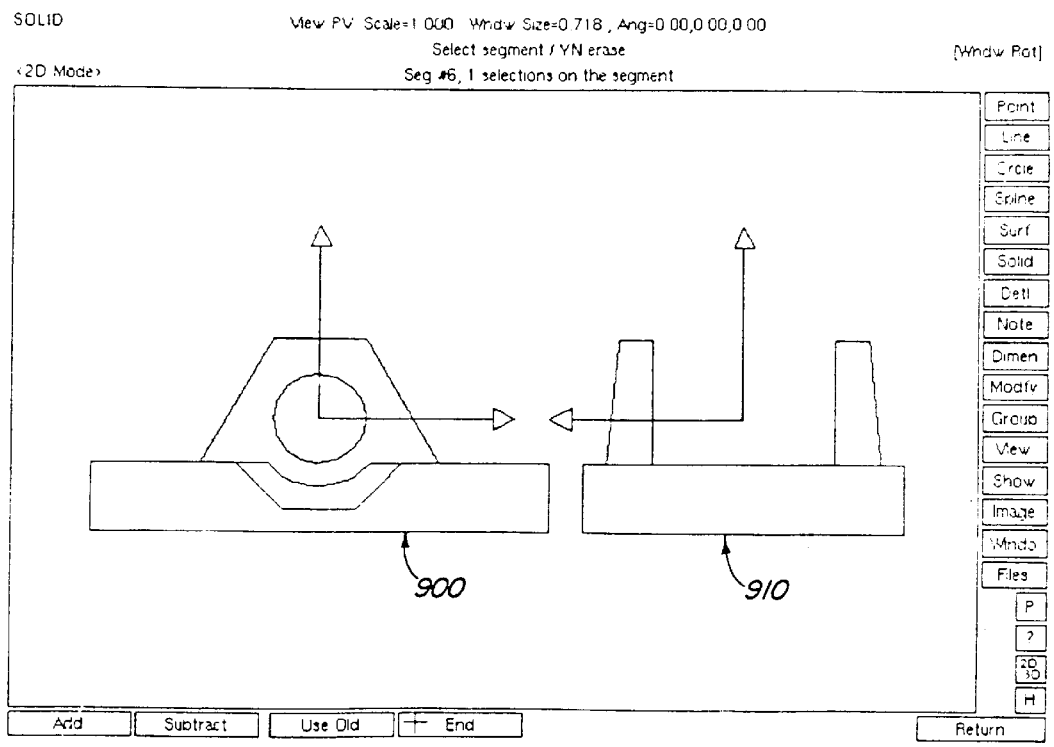
FIG. 9 is an illustration of a pair of two dimensional drawings in accordance with the present invention.
Figure 10:
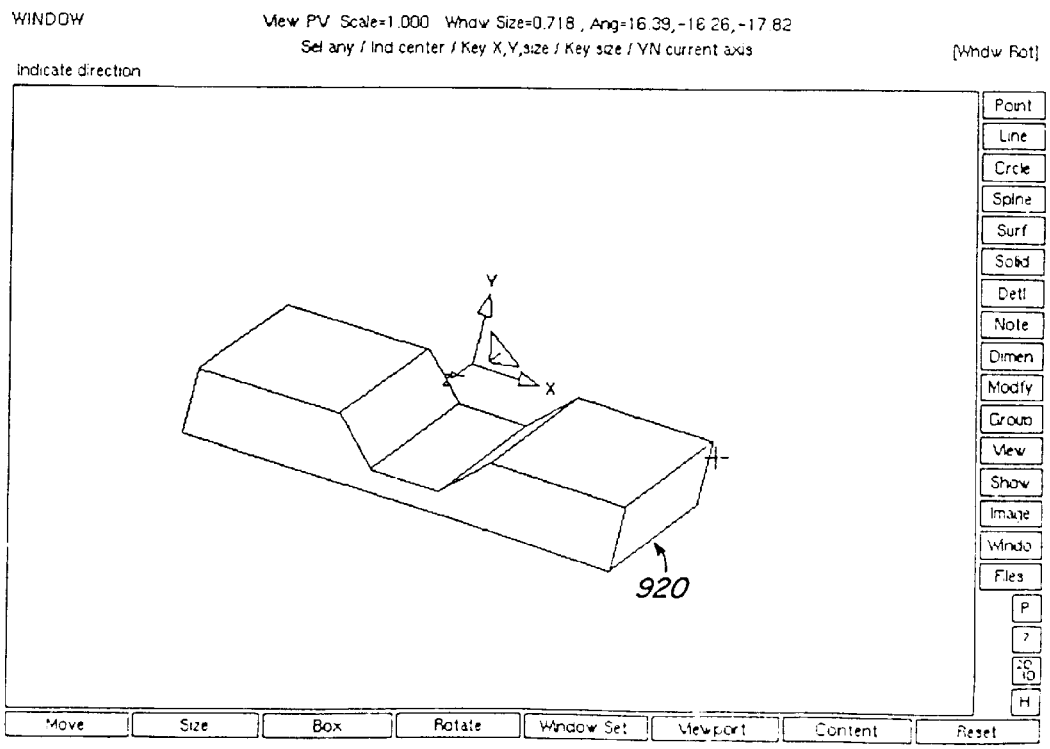
FIG. 10 is an illustration of a solid model in accordance with the present invention.

A further example involving a more complex geometry is presented in FIG. 9 and 10. In FIG. 9, a pair of two dimensional views of an object are presented at 900 and 910 respectively. A solid representation of the object is generated by selecting the front face and the back face. The generated solid is shown in FIG. 10.

Parametric Entities

In FIG. 11, the solid function parametric modification menu options are listed and their functions are elaborated upon. At label 1000, the menu options are displayed as they appear on a CAD display. If a user selects Def Parent at label 1100, then the user is prompted to point to a plane of a solid that will function as the parent plane. The plane must be paired with a parallel offset plane whose distance is a variable that the user would like to change.

Label 1120 lists the Define Offset menu option. This option allows a user to define a plane of the solid parallel to the parent plane as an offset plane. Label 1130 depicts the Change Parameter menu option. This item is selected to display the distance value between pairs of parent and offset planes. Label 1140 depicts the Show All menu option. This option is selected to display all planes that are not currently displayed for the solid object. Label 1150 is the No Show option which temporarily suppresses the display of a selected plane of the current solid so that a hidden plane can be selected.

To commence a parametric design a user selects a solid object from the display as described in function block 1300 of FIG. 13, and shown at label 1200 of FIG. 12. Optionally, the user can remove some faces from the solid object using the No Show function as shown in function block 1310 of FIG. 13. Then, the user defines a parent face by selecting a polygon of the solid as shown in function block 1320 and depicted at 1290 of FIG. 12. Offset faces parallel to the first face are selected next as shown in function block 1330 and depicted at 1270 and 1250 of FIG. 12. The distances between the offset faces 1252 and the distance between the parent face and the first offset face 1254 are calculated. The distance D1 1254 is a variable distance that will be adjusted. Whereas, the distance D2 1252 is a fixed distance that remains constant during this operation.

If the user selects the NoShow function then the logic set forth in FIG. 14 is employed to make the face invisible on the display. The user initially selects a polygon (face) of a solid and converts the pointer to a loop id as shown in function block 1410. Then, the face is validated by searching the PFace table for the Face that contains the loop. If the face is found, then the selected polygon is a valid face as depicted in decision block 1420. If not, then control flows to 1410. If the face is valid, then the system sets the attribute of the selected polygon to visibility off as shown in 1430.

Figure 15:
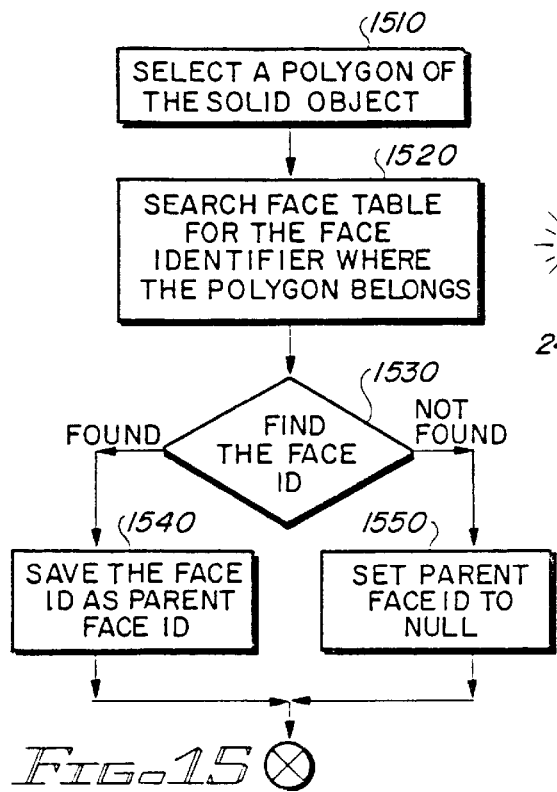
FIG. 15 is a flowchart of the logic implementing the defining a parent face in accordance with the subject invention.

The logic for defining a parent face is set forth in FIG. 15. As above, the user begins by selecting a polygon of the solid object as shown in function block 1510. Then, the system searches the PFace table to identify the Face that contains the loop as depicted in function block 1520. If the Face is identified in decision block 1530, then the Face ID as the Parent Face ID as shown in function block 1540. However, if the Face ID is not found, then the Parent Face ID is set to a null value as shown in function block 1550.

Figure 16:
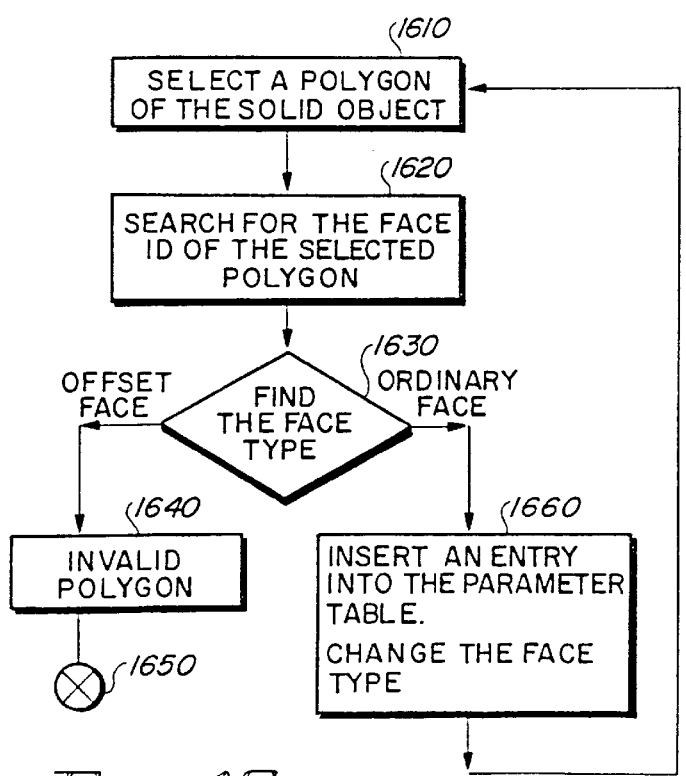
FIG. 16 is a flowchart of the logic implementing the defining an offset face in accordance with the subject invention.

The logic for defining an offset face is set forth in FIG. 16. The user initially must select a polygon of the solid object as depicted in function block 1610. Then, the PFace table is searched for the Face ID of the selected polygon as depicted in function block 1620. A search is next made, in block 1630, to determine the type of the Face and based on the type, control is passed to one of two function blocks 1650 or 1660. If the Face type is ordinary, then control is passed to function block 1660 where the distance between the Parent Face and the offset face is calculated and an entry to the parameter table is made to reflect the change. Finally, the Face Type is also changed to Offset Face. If the Face Type is already an Offset Face, then an invalid polygon has been selected as shown in function block 1640, and control is passed to an error routine. An Offset Face can be redefined as a parent face for another offset face to form a nested relation.

FIG. 17 presents the logic implementing the Change Parameter function. Function block 1700 indicates the first step is to select a polygon from the solid displayed on the graphic display. Then, the system searches through the PFace table for the face ID which the selected polygon is associated with as shown in function block 1710. Subsequently, the face ID is used to determine the face type as depicted in decision block 1720. If the face type is an ordinary face, then the polygon is highlighted on the display as depicted in function block 1730, the distance from the origin to the face is displayed, and control passes to function block 1760. However, if the face type is an offset face, then the PFace table is searched for the identifier of the parent face and the associated polygon as shown in function block 1740. Then, the distance between the two offset faces is calculated, displayed and the polygons are highlighted as shown in function block 1750.

Function block 1760 depicts the next step, prompting the user to enter a new value for the distance via the keyboard. The new value is used to update the parameter table. If the polygon is a parent offset type, then modify the parameter of the selected face. If it is an ordinary face, then the parameter of the ordinary face is modified. Then, as illustrated in function block 1770, the PFace table is converted into a Face table. Finally, the solid is regenerated by sending the Face table and the construction list to the solid modeler to generate the modified solid as shown in function block 1780.

FIG. 12 shows a first solid 1200 and a second solid 1210 that are modified using the parametric entity function in accordance with the invention to create a finished assembly 1220. The distance D1 1254 in solid 1200 must be correlated with distance D3 1256 to complete the assembly correctly. Thus, the user initially selects D1 1254 as the variable distance from P1 1290 to O1 1270. The distance D2 is defined as a fixed distance, and the variable distance is equated to D3 1256. Thereafter, the system expands D1 1221 to comply with D3 1256 and completes the assembly.

Surface Normal Display

In a normal CAD system, a surface can be created regardless of the facing. However, a surface has two faces, one is facing in, and the other is facing out. Depending on the position or orientation of the surface in a composite object. Surface normal is a reference for indicating the facing of a surface. It is also a vector for calculating the shading value. Since the surface normal is not specified during the creation of the surface, the image of the shaded surface may not appear correct to the viewer.

Figure 24:
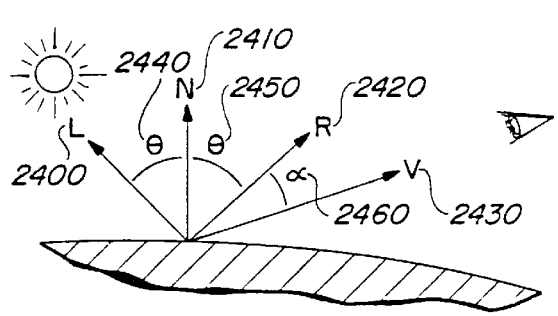
FIG. 24 is an illustration of diffracted light from a display in accordance with the subject invention.

Examples of surfaces displayed which employ the subject invention are presented in FIGS. 20, 21, 22 and 23. The logic for the processing is set forth in the flowcharts illustrated in FIGS. 18 and 19. FIG. 24 illustrates the variables behind the mathematics used to implement some of the invention's logic. Finally, the detailed source code and data structures used to implement the logic is presented and described below.

Referring to FIG. 18, function block 1800 shows the first step which displays the shaded surfaces without user specified shading. To shade the surface, the system generates polygons to approximate the surface. By shading each polygon according to the normals to the surface on each vertex of the polygon the shaded surface is indicated appropriately.

To shade a polygon, the system prepares a color table for shading and calculates the intensity of each vertex of the polygon. The algorithm for preparing the color table is shown in the "C" listing set forth in Appendix 7. The logic has two steps. Step one: linearly interpolate the color values of red, green and blue (RGB) separately. To generate the three tables, (RGB) with constant incrementation from the specified ambient light value to the full color of the object. For the current display device, the shading color is generated into two-hundred levels.

Step two: the algorithm uses a cosine function on top of the result of step one to extend the range of the shading colors. The final color table will range from the specified ambient light value to shiny, bright color that will give the shaded object a shining spot when the reflection of the light source on the surface is toward the viewer's eye.

To shade a polygon, the illumination value of each vertex must be calculated. Illumination (I) is calculated with the following equation:

$$I=Amb*Ka+Lv*Kd*(L\times N)+Ks*(R\times V)^m$$

Referring to FIG. 24, Amb is the ambient light value. Ka indicates how much of the ambient light is reflected from the object's surface. Lv is the intensity of the light source. L 2400 is the light vector. N 2410 is normal to the surface at the vertex. (L×N) 2440 is the cosine value of the angle between L vector and N vector. Kd indicates how much of the diffused light reflected from the surface. R 2420 is the reflection vector. V 2430 is the vector from the vertex to the eye. (R×V) 2460 is the cosine of the angle between vector R and vector V.

Since the illumination value is a sum of the ambient factor, diffuse factor and specular factor, the result may not fall within the acceptable range. Especially, when there are multiple light sources and the graphic hardware has a limited resolution. Thus, the following modification to the original equation is made to enhance shading.

$$I=Max(I[1], I[2], I[3], \ldots I[n]) \; I[i]=A+(1-A)*D[i]+(1-A-(1-A)*D[i]*S[i];$$

where i=1,2 . . . n for n light sources. I[i] is the illumination value for the ith light source.

$$A=amb*Ka; \; D[i]=Lv[i]*(L[i]\times N); \; S[i]=(R\times V)^m$$

When the intensity of each vertex of a polygon is resolved, the intensity is converted to an index to the color table. (See data structure listing set forth in Appendix 8.)

Then, the user is prompted to select a particular surface to display as shown in function block 1810. The surface is selected by pointing with the cursor and using the pointer's coordinates to select the appropriate surface from the CADAM data base. Next, the selected surface is erased as shown in function block 1820. Then, the surface data is rearranged as set forth in function block 1830.

Four kinds of surface data can be rearranged, ruled surfaces, revolved surfaces, boundary surfaces, boundary surfaces and skin surfaces. The data structure of these surfaces is set forth set forth in Appendix 9.

For ruled surfaces or revolved surfaces, the sequences of the control points are inverted and the knot sequences of its splines are calculated. For boundary surfaces, the sequences of the control points of spline one and two are inverted, and their knot sequences are recalculated. Splines three and four are swapped. For skin surfaces, each profile spline has its corresponding control points inverted and the knot sequences are recalculated. FIG. 19 sets forth the detailed logic presented in function blocks 1830 and 1840.

Finally, as shown in function block 1840, the selected surface is shaded based on the rearranged information.

Boundary Surfaces

As introduced, a boundary surface stores four splines which form a closed boundary of the surface. The surface normal processing logic is set forth in Appendix 10.

Figure 20:
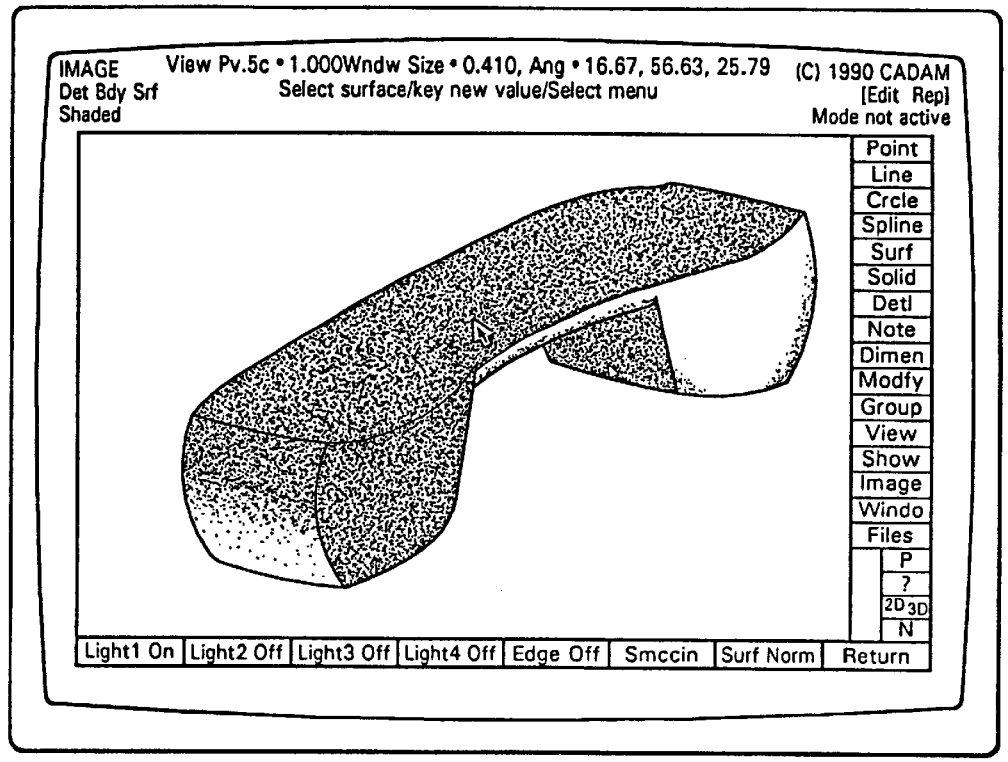
FIG. 20 is an illustration of a reverse normal of a top surface in accordance with the subject invention.
Figure 21:
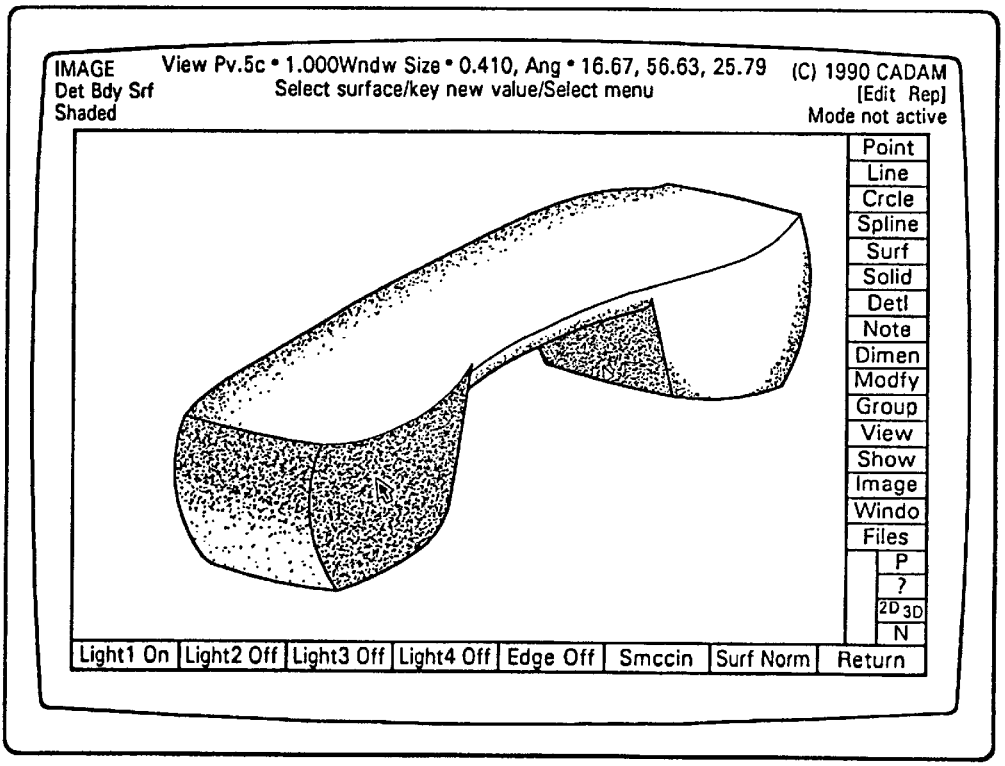
FIG. 21 is an illustration of a select side surface display in accordance with the subject invention.
Figure 22:
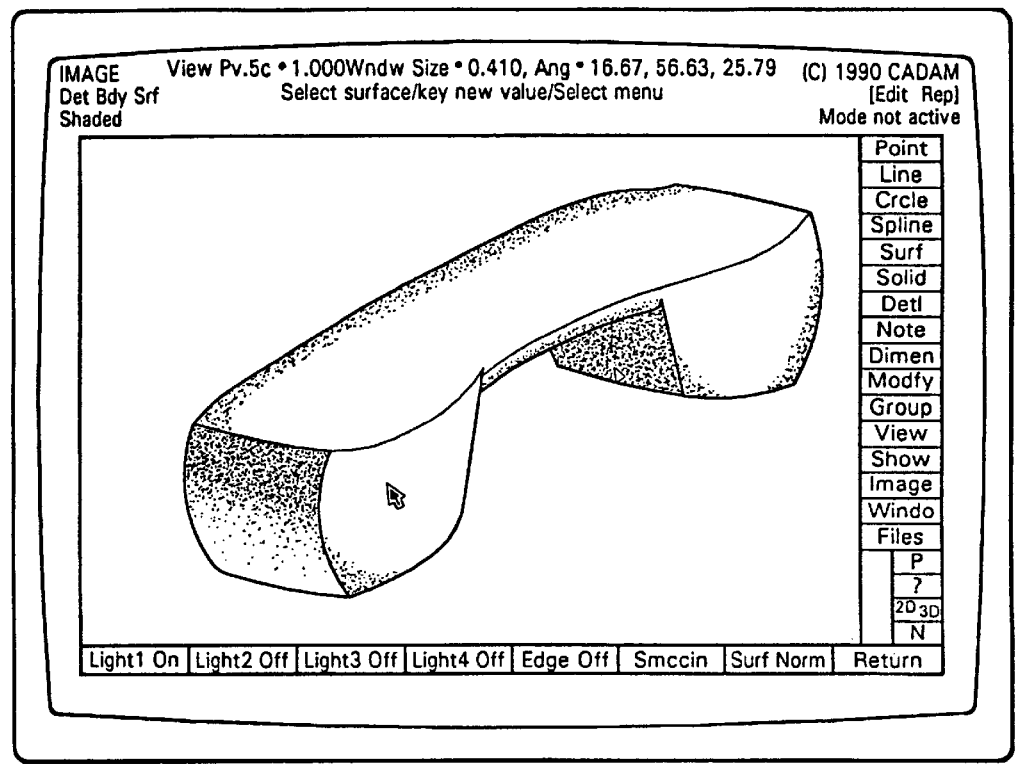
FIG. 22 is an illustration of a reverse normal of a side surface display in accordance with the subject invention.
Figure 23:
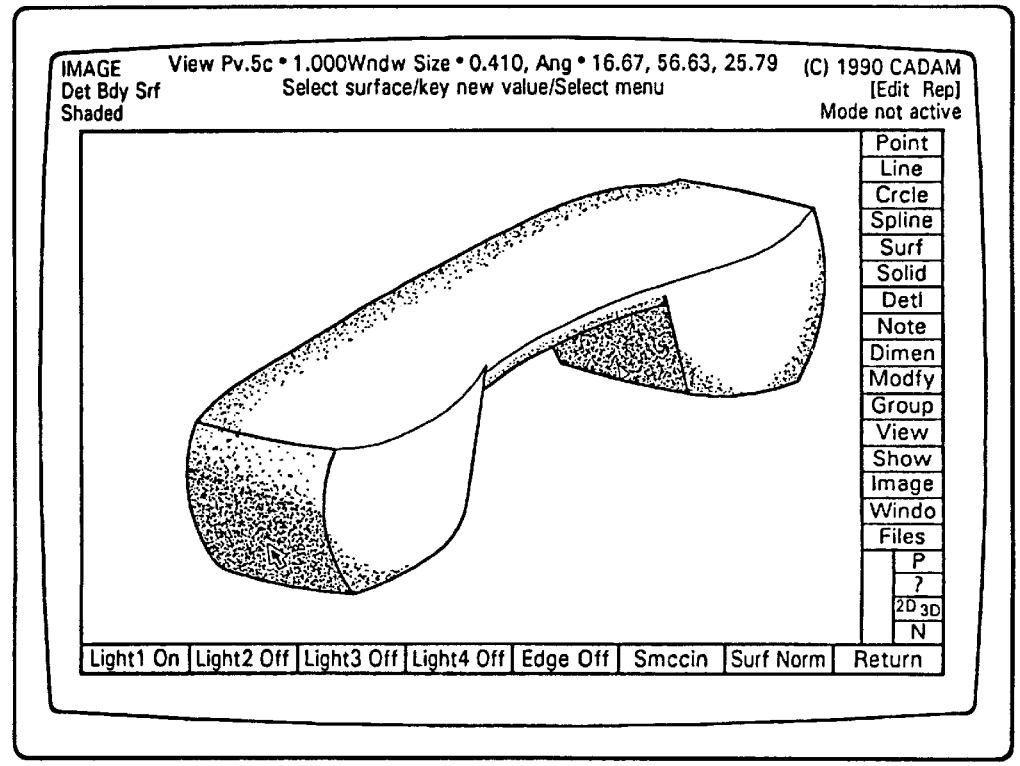
FIG. 23 is an illustration of a reverse normal of a front surface in accordance with the subject invention.

Four examples of shaded surfaces are presented in FIGS. 20, 21, 22 and 23. FIG. 20 shows a reverse surface normal of a top surface. FIG. 21 shows a surface normal of a side surface. FIG. 22 shows a reverse normal of a side surface, and FIG. 23 shows a reverse normal of a front surface.

While the invention has been described in terms of a preferred embodiment in a specific system environment, those skilled in the art recognize that the invention can be practiced, with modification, in other and different hardware and software environments within the spirit and scope of the appended claims.

APPENDIX 1:
```
/*:
: PART V - The temporary records for keeping 2D elements
:............................................................
:
: option:  1- extrusion
:          2- taper
:          3- pyramid
:          4- rotation
:
: operation:
:          1- add
:         -1- subtract
:
: tip[2]      : a temporary cadam pointer to a point of a pyramid (not used)
: front, back : record front face and back face pointer (pointer to line)
: numbdry     : number of boundary segments in the bdry array
: bdry        : pointer to line and circle
: bdry1 bdry2 : only case 2 will use both index ( for taper only )
:               rest of the cases use bdry1
:............................................................
:
: IDENTIFICATION:
:
: AUTHOR ......... ALLEN CHEN
: DATE ........... 10/15/89
:............................................................
*/ struct  bdrytype
{
    short   numbdry;
```

```
short    bdry[maxbdry][2];
};

struct  frametype
{
short    option;
short    operator;
short    front[2], back[2];
short    tip[2];
struct   bdrytype * bdry1;
struct   bdrytype * bdry2;
};

struct  film
{
short    numframe;
struct   frametype * frame[maxframe];
};
```

APPENDIX 2:
```
/*==========================================================
 : PART I - CONSTANT DEFINITIONS FOR FACE TABLE
 :.........................................................
 */
#define  FSIZE    200
#define  MXSIZE   20
#define  maxbdry  100
define  maxframe 100 define  VARSIZE  100
/*=========================================================
 : PART II - THE FACE TABLE & PARAMETRIC TABLE
 :.........................................................
 :
 : PFace
 :
 :  FaceType :
 :      1- PlaneFace
 :         subtype function
 :         ---------------
 :            0     original plane face
 :            1     define offset plane, define   : pointer to variable table
 :                  which defines the
 :                  offset value or formula
 :            2     angled face
 :           11     define chamfer plane
 :
 :      2- Circular Cylinder
 :         subtype function
```

Page 3

SA9-90-085

```
 :   -------   ---------------------------------------------
 :      0      original Cylinder, defines xy and R
 :      1      define offset cylinder, define dR
 :      2      define location
 :     11      define round
 :     12      define fillet
 :
 :    3- ConicFace
 :    4- RuledFace
 :    5- FreeFormFace
 :    x- Arc    define cylinder number, A1, A2
 :
:..............................................................
:
: Fcode - mark the usage of the face
:
:   bit 1: solid faces
:       2: construction faces
:       3: symmetric faces (shall be defined by its children)
:       4: datum face (??? unknown yet)
:
:   note : bit map 15,14,13......3,2,1
:
:..............................................................
:
: ModVar - count how many var were changed,
:          indicate the necessity of updating Var
:          table by bringing SmallTalk parser
:          not implemented in current version.
:
:..............................................................
:
: struct PlaneSym
:
:   pair : stores the other symmetric face to the base
:   base : the base face
```

*Page 4*

```
:........................................................
:
: struct PlaneChm
: {
:   p1,p2,pw  -  pointer to plane faces
:   v1,v2     -  pointer to variable table
:
:........................................................
:
: struct Parameter
: {
:   mode -  1: value
:           2: text
:
*/
#define ORGPLANE 0
#define OFFPLANE 1
#define SYMPLANE 2
define CHMPLANE 11 struct PlaneOrg
{
    double   A, B, C, D;
};

struct PlaneOff
{
    short    base;
    short    varid;
};

struct PlaneSym
{
    short    base, pair;
    short    varid;
};
```

```
struct PlaneChm
    {
    short    p1, p2, pw;
    short    v1, v2;
    };

union plane_ptr
    {
    struct   PlaneOrg    Porg;
    struct   PlaneSym    Psym;
    struct   PlaneOff    Poff;
    struct   PlaneChm    Pchm;
    };

struct PPlane
    {
    short        subtype;
    union  plane_ptr pclass;
    };

struct  PCylinder
    {
    double   R, X, Y, A1, A2, Z1, Z2;
    short    MatrixIndex;
    short    Udisp;
    struct   POINT *vertics[2][13];
    };

struct   PCone
    {
    double   R1, R2, X, Y, A1, A2, Z1, Z2;
    short    MatrixIndex;
    short    Udisp;
    struct   POINT *vertics[2][13];
    };
```

```
struct   PRuled
         {
         short      MatrixIndex;
         short      Udisp;
         struct     BSPLINE Bspl;
         };

struct   PFreeForm { int NU, NW; double *ControlPoints[50][50]; };

struct   Parameter
         {
         char       Label[8];
         double     value;
         char       text[72];
         short      mode;
         };

union face_ptr
         {
         struct     PPlane      * PlaneFace;
         struct     PCylinder   * CircularCylinder;
         struct     PCone       * ConicFace;
         struct     PRuled      * RuledFace;
         struct     PFreeForm   * FreeFormFace;
         };

struct   PFace
         {
         short      FaceType;
         short      Fcode;
         union      face_ptr fclass;
         };

struct   Matrix
         {
```

*Page 7*

```
    double    p1[3], p2[3], p3[3], p4[3];
};

struct  PFaces
{
    short       NumberFaces;
    short       NumberMatrix;
    short       NumberVar;
    short       ModVar;
    struct      PFace       *Face       [FSIZE];
    struct      Matrix      *Matrix     [MXSIZE];
    struct      Parameter   *Var        [VARSIZE];
};
```

APPENDIX 3:
/*=================================================================
: PART III - THE FACE TABE FOR INTERFACING WITH SOLID MODULE
:.................................................................
:
: define face table interface to solid
:
: define face tables
:
: MatrixIndex stores the index to matrix list
: SameFace    stores the index to the first equivalent face
:             shall be maintained every time a object was created
: Matrix      the array will start from 13 to 39.
:
: FaceTable
:
:       FaceType :  1- PlaneFace
:                   2- Circular Cylinder
:                   3- ConeFace
:                   4- RuledFace
:                   5- FreeFormFace
:
:.................................................................
:
: IDENTIFICATION:
:
: AUTHOR ......... FRANK NIU
: DATE   ......... -/--/89
:.................................................................
*/ struct   PlaneFace
{

```
double   A, B, C, D;
};

struct CircularCylinder
{
    double   R, X, Y, A1, A2, Z1, Z2;
    short    MatrixIndex;
    short    Udisp;
    struct   POINT *vertics[2][13];
};

struct ConeFace
{
    double   R1, R2, X, Y, A1, A2, Z1, Z2;
    short    MatrixIndex;
    short    Udisp;
    struct   POINT *vertics[2][13];
};

struct RuledFace
{
    short    MatrixIndex;
    short    Udisp;
    struct   BSPLINE Bspl;
};

struct FreeFormFace { int NU, NW; double *ControlPoints[50][50]; };

struct FaceTable
{
    short    FaceType;
    struct   PlaneFace          *PlaneFace;
    struct   CircularCylinder   *CircularCylinder;
    struct   ConeFace           *ConeFace;
    struct   RuledFace          *RuledFace;
    struct   FreeFormFace       *FreeFormFace;
```

```
};

struct  Faces
{
    short   NumberFaces;
    short   NumberMatrix;
    struct  FaceTable   *FaceTable  [FSIZE];
    struct  Matrix      *Matrix     [MXSIZE];
};
```

```
APPENDIX 4:
/*=============================================================================
 :
 : PART IV - The construction tree
 :
 :...........................................................................
 :
 : component list
 :
 :   . operator :        0 disabled component
 :                       1 add component
 :                      -1 substract component
 :
 :   . component type :  1 extrusion
 :                       2 taper
 :                       3 pyramid
 :                       4 rotation
 :
 :...........................................................................
 :
 : IDENTIFICATION:
 :
 :   AUTHOR ......... ALLEN CHEN
 :   DATE   ......... 10/15/89
 :
 :...........................................................................
 */ struct  OneComponent
    {
    short    option;
    short    operator;
    short    numbdry;
    short    boundary[maxbdry];
    short    front, back;
```

```
};
struct  Comphd
{
     short    NumberComponent;
     struct   OneComponent * component[maxframe];
};
```

APPENDIX 5:
/*****************************************************************
 * Common Header files
 *****************************************************************
*/
include <math.h>
include <malloc.h>
include "3dgml.f"
include "3duti.f"
include "3dmil.f"
include "units.h"
include "bspline.h"
include "param.h"
include "stb.h"

/*****************************************************************
 * Header files for C_gm_telsld()
 *****************************************************************
*/
include "fkgp3d.h"

/*****************************************************************
 * Header files for C_gm_trsld3x()
 *****************************************************************
*/
include "gt3d.h"

/*****************************************************************
 * Definitions for C_gm_telsld()
 *****************************************************************
*/
define OrgPlane fclass.PlaneFace->pclass.Porg
define Cylinder fclass.CircularCylinder
define ConFace  fclass.ConicFace

/*****************************************************************

```
 * Definitions for C_gm_trsld3x()
 **************************************************************************
 */
define OrgPlane fclass.PlaneFace->pclass.Porg /**************************************************************************
 * Function decleorations for C_gm_telsld()
 **************************************************************************
 */
static void   C_gm_1_remake_ABCD      ( short, double[],
                                        double, double, double, double,
                                        double*, double*, double*, double* );
static void   C_gm_1_remake_matrix    ( short, double[],
                                        double[][3], double[][3] );
static void   C_gm_2_point_on_plane(  double, double, double, double,
                                      double, double, double,
                                      double*, double*, double* );
static void   C_gm_2_rotate_point     ( double[], double[], double[] );
static void   C_gm_2_mirror_point     ( double[], double[], double[] );

/**************************************************************************
 * Function declearations for C_gm_trsld3x()
 **************************************************************************
 */
short C_trplnorm( short, double [], double[], double, double [], double *);
short C_tmmxab ( double[],double[],double[],double[],double[]);
short C_tmmxlc ( double[],double[],double[],double[],double[]);

/**************************************************************************
 * [Function Name]
 *     iret = C_gm_telsld ( iopt, tdata, solid_ptr )
 *
 * [Category]
 *     Geometric Calculation ( Translation of element )
 *
 * [Description]
```

```
*    Transform SOLID
*
* [Parameters]
*    (i) short    iopt         -- Processing Option
*                                   1 : Translation (Move)
*                                   2 : Mirroring
*                                   3 : Rotation
*                                   4 : Scaling
*
*    (i) double   tdata[]      -- Data for Translation
*                                   iopt=1 => tdata[3]  : DX,DY,DZ
*                                   iopt=2 => tdata[12] : Data of Mirror Plane
*                                   iopt=3 => tdata[7]  : X,Y,Z (Point on Axis)
*                                                         A,B,C (Vextor of Axis)
*                                                         ANG   (Rotation Angle)
*                                   iopt=4 => tdata[4]  : X,Y,Z (Center of Scale)
*                                                         SCL   (Scaling Factor)
*
*    (i) short    solid_ptr[2] -- Pointer of Solid (In)
*
*    (o) short    iret         -- Return Code (0:OK, 1:Error)
*
* [External Variables]
*    struct PFaces    PFaces
*    struct Comphd    CompList
*
* [Calls]
*    Retv_Solid               ( defparam.c )
*    Q_subtype                (      "     )
*    Q_Plane_ABCD             (      "     )
*    Save_Parameters          (      "     )
*    Save_Solid               (      "     )
*    del_solid_polygons       ( entersd.c  )
*
* [Restriction]
*
```

```
* [Algorithm]
*
*     1. Get face table from elmptr
*     2. Transform face table
*     3. Transform working plane
*     4. Validate the transformed solid
*     5. Save the transformed solid
*
***************************************************************
*
*  Created by   .....  Eiji Nakano
*     Date      .....  2/23/90
*
*  Modified by  .....  Allen Chen
*     Date      .....  6/25/90
*     Nature(#1) .....  Change stb.h and param.h
*
*  Modified by  .....  Allen Chen
*     Date      .....  10/3/90
*     Nature(#2) .....  use local variables (PFaces, Solid, Complist)
*                       copy solid is a special case, done by cpysld() in
*                       solidmi.c.
*                       Fix error in scaling face table and working plane.
*
***************************************************************
*/ short C_gm_telsld( iopt, tdata, solid_ptr )
short   iopt;
short   solid_ptr[];
double  tdata[];
{
    char    sname[128];
    char    lbl[8],str[72];
```

```
short    fid,stype;
short    ftype;
short    iret;
short    i;
short    indata[10];
short    pid,mode;
double   value;
double   A,B,C,D;
double   AA,BB,CC,DD;
double   new_matrix[4][3], old_matrix[4][3];

struct PFaces    *PFaces;
struct Comphd    *CompList;
struct SolidTable *Solid;

PFaces = (struct PFaces *) malloc (sizeof (struct PFaces));
if (PFaces == 0)   return 200;
CompList = (struct Comphd *) malloc (sizeof(struct Comphd));
if (CompList == 0)
   {
   free(PFaces);
   return 200;
   }
Solid = (struct SolidTable *) malloc (sizeof(struct SolidTable));
if (Solid == 0)
   {
   free(PFaces);
   free(CompList);
   return 200;
   } indata[0] = 0;

Retv_Solid( solid_ptr, PFaces, CompList, sname );

for( fid=1; fid<=PFaces->NumberFaces; fid++ )
```

Page 18

SA9-90-085

```
{
    ftype = PFaces->Face[fid]->FaceType;
/*********/
/* plane */
/*********/
    if( ftype == 1 )
    {
    /*
    : Allen Chen 10/9/90
    : offset faces shall be scaled with scaling value
    */
    Q_subtype( PFaces, fid, &stype );
    if ( stype != 0 )
    {
        if (iopt == 4)
        {
            iret = Q_OffFace(PFaces,fid,&pid,lbl,&value,str,&mode);
            if (iret == 0)
            {
                value *= tdata[3];
                iret = Mod_OffFace((short)1,PFaces,pid,fid,value,str);
            }
        }
    }
    else
    {
    Q_Plane_ABCD( PFaces, fid, &A, &B, &C, &D );

C_gm_1_remake_ABCD( iopt, tdata, A, B, C, D,
                                     &AA, &BB, &CC, &DD );

PFaces->Face[fid]->OrgPlane.A = AA;
    PFaces->Face[fid]->OrgPlane.B = BB;
    PFaces->Face[fid]->OrgPlane.C = CC;
    PFaces->Face[fid]->OrgPlane.D = DD;
```

```
}
/*******************************************/
/* cylinder or conic and scaling */
/*******************************************/
else if( (ftype == 2 || ftype == 3) && iopt == 4 )
{
    /************/
    /* cylinder */
    /************/
    if( ftype == 2 )
    {
        PFaces->Face[fid]->Cylinder->R *= tdata[3];
        PFaces->Face[fid]->Cylinder->X *= tdata[3];
        PFaces->Face[fid]->Cylinder->Y *= tdata[3];
    }
    /**********/
    /* conic */
    /**********/
    else if( ftype == 3 )
    {
        PFaces->Face[fid]->ConFace->R1 *= tdata[3];
        PFaces->Face[fid]->ConFace->R2 *= tdata[3];
        PFaces->Face[fid]->ConFace->X  *= tdata[3];
        PFaces->Face[fid]->ConFace->Y  *= tdata[3];
    }
} for( i=1; i<=PFaces->NumberMatrix; i++ )
{
    C_ut_dpsto( 3, PFaces->Matrix[i]->p1, old_matrix[0] );
    C_ut_dpsto( 3, PFaces->Matrix[i]->p2, old_matrix[1] );
    C_ut_dpsto( 3, PFaces->Matrix[i]->p3, old_matrix[2] );
    C_ut_dpsto( 3, PFaces->Matrix[i]->p4, old_matrix[3] );
    C_gm_1_remake_matrix( iopt, tdata, old_matrix, new_matrix );
    C_ut_dpsto( 3, new_matrix[0], PFaces->Matrix[i]->p1 );
```

```
       C_ut_dpsto( 3, new_matrix[1], PFaces->Matrix[i]->p2 );
       C_ut_dpsto( 3, new_matrix[2], PFaces->Matrix[i]->p3 );
       C_ut_dpsto( 3, new_matrix[3], PFaces->Matrix[i]->p4 );
    }
/*.....................................................................
 : Allen Chen 10/2/90
 : option 1 is replacing the model block with the new data.
 : See "solidmi.c" for details.
 :.....................................................................
*/
    iret = mksolid (PFaces, CompList, Solid);
    if (iret == 0)
       iret = C_mi_sdstore (((short)1, PFaces, CompList, sname, ihdata, solid_ptr );

C_sd_cpftable(PFaces);
    C_sd_ccompl(CompList);
    FreeSolid (Solid);
    free (Solid);
    free (CompList);
    free (PFaces);
    if (iret != 0) iret = 1;
    return( iret );
}

/*=====================================================================
 : static void C_gm_1_remake_ABCD( iopt, tdata, A, B, C, D, AA, BB, CC, DD )
 :
 : make new plane data from old plane data
 :
 : input    short    iopt    ---    1    move
 :                                  2    mirror
 :                                  3    rotate
 :                                  4    scale
 :          double   tdata[] --     Data for Translation
 :                                  iopt=1 => tdata[3]: DX,DY,DZ
 :                                  iopt=2 => tdata[12]:Data of Mirror Plane
```

```
:                                        iopt=3 => tdata[7]: X,Y,Z (Point on Axis)
:                                                            A,B,C (Vextor of Axis)
:                                                            ANG   (Rotation Angle)
:                                                            X,Y,Z (Center of Scale)
:                                        iopt=4 => tdata[4]: SCL   (Scaling Factor)
:         double   A,B,C,D    - old plane data
:
: output  double  *AA,*BB,*CC,*DD - new plane data
:
: Allen Chen 10/8/90
: make the vector [AA,BB,CC] as unit vector
:
*/
static void C_gm_1_remake_ABCD( iopt, tdata, A, B, C, D, AA, BB, CC, DD )
short   iopt;
double  tdata[];
double  A,B,C,D;
double  *AA,*BB,*CC,*DD;
{
    double  pt1[3],pt2[3],dist[3];
    double  d;

/*********/
/* move */
/*********/
    if( iopt == 1 )
    {   *AA = A;
        *BB = B;
        *CC = C;
        *DD = A*tdata[0] + B*tdata[1] + C*tdata[2] + D;
    }
/***********/
/* mirror */
/***********/
    else if( iopt == 2 )
    {   C_gm_2_point_on_plane( A, B, C, D, 0.0, 0.0, 0.0,
```

```
        pt2[0] = pt1[0] + A;
        pt2[1] = pt1[1] + B;
        pt2[2] = pt1[2] + C;
        C_gm_2_mirror_point( pt1, tdata, pt1 );
        C_gm_2_mirror_point( pt2, tdata, pt2 );

*AA = pt2[0] - pt1[0];
        *BB = pt2[1] - pt1[1];
        *CC = pt2[2] - pt1[2];
        d = sqrt((*AA)*(*AA) + (*BB)*(*BB) + (*CC)*(*CC));
        *AA /= d;
        *BB /= d;
        *CC /= d;
        *DD = *AA*pt1[0] + *BB*pt1[1] + *CC*pt1[2];
    }
    /**********/
    /* rotate */
    /**********/
    else if( iopt == 3 )
    {   C_gm_2_point_on_plane( A, B, C, D, 0.0, 0.0, 0.0,
                               &pt1[0], &pt1[1], &pt1[2] );

pt2[0] = pt1[0] + A;
        pt2[1] = pt1[1] + B;
        pt2[2] = pt1[2] + C;
        C_gm_2_rotate_point( pt1, tdata, pt1 );
        C_gm_2_rotate_point( pt2, tdata, pt2 );

*AA = pt2[0] - pt1[0];
        *BB = pt2[1] - pt1[1];
        *CC = pt2[2] - pt1[2];
        d = sqrt((*AA)*(*AA) + (*BB)*(*BB) + (*CC)*(*CC));
        *AA /= d;
        *BB /= d;
        *CC /= d;
        *DD = *AA*pt1[0] + *BB*pt1[1] + *CC*pt1[2];
```

```c
    }
/**********/
/* scale */
/**********/
    else if( iopt == 4 )
    { C_gm_2_point_on_plane( A, B, C, D, tdata[0], tdata[1], tdata[2],
                                                 &pt1[0], &pt1[1], &pt1[2] );

C_ut_dpsub( 3, pt1, tdata, dist );
      C_ut_dpmult( 3, tdata[3], dist, dist );
      C_ut_dpadd( 3, tdata, dist, pt1 );

*AA = A / tdata[3];
      *BB = B / tdata[3];
      *CC = C / tdata[3];
      d = sqrt((*AA)*(*AA) + (*BB)*(*BB) + (*CC)*(*CC));
      *AA /= d;
      *BB /= d;
      *CC /= d;
      *DD = *AA*pt1[0] + *BB*pt1[1] + *CC*pt1[2];
    }
}
/*==============================================================================
: static void C_gm_1_remake_matrix( iopt, tdata, old_matrix, new_matrix )
:
: make new matrix data from old matrix
:
: input   short    iopt     --    1  move
:                                 2  mirror
:                                 3  rotate
:                                 4  scale
:         double   tdata[]  --    Data for Translation
:                                 iopt=1 => tdata[3]: DX,DY,DZ
:                                 iopt=2 => tdata[12]:Data of Mirror Plane
:                                 iopt=3 => tdata[7]: X,Y,Z (Point on Axis)
:                                                    A,B,C (Vextor of Axis)
:                                                    ANG   (Rotation Angle)
```

```
:                               iopt=4 => tdata[4]: X,Y,Z (Center of Scale)
:                                                    SCL    (Scaling Factor)
:       output    double old_matrix[4][3] -- present matrix
                  double new_matrix[4][3] -- regenerated matrix
*/
static void C_gm_1_remake_matrix( iopt, tdata, old_matrix, new_matrix )
short   iopt;
double  tdata[];
double  old_matrix[][3];
double  new_matrix[][3];
{
        short   i;
        double  pt1[3],pt2[3];
        double  dist[3];
/*********/
/* move */
/*********/
        if( iopt == 1 )
        {
                C_ut_apadd( 3, old_matrix[3], tdata, new_matrix[3] );
                C_ut_dpsto( 3, old_matrix[0], new_matrix[0] );
                C_ut_dpsto( 3, old_matrix[1], new_matrix[1] );
                C_ut_dpsto( 3, old_matrix[2], new_matrix[2] );
        }
/***********/
/* mirror */
/***********/
        else if( iopt == 2 )
        {       pt1[0] = pt1[1] = pt1[2] = 0.0;
                C_gm_2_mirror_point( pt1, tdata, pt1 );

for( i=0; i<3; i++ )
                {       C_gm_2_mirror_point( old_matrix[i], tdata, pt2 );
                        C_ut_dpsub( 3, pt2, pt1, new_matrix[i] );
                }
```

```
            C_gm_2_mirror_point( old_matrix[3], tdata, new_matrix[3] );
    }
/**********/
/* rotate */
/**********/
    else if( iopt == 3 )
    {
        pt1[0] = pt1[1] = pt1[2] = 0.0;
        C_gm_2_rotate_point( pt1, tdata, pt1 );

for( i=0; i<3; i++ )
        {   C_gm_2_rotate_point( old_matrix[i], tdata, pt2 );
            C_ut_dpsub( 3, pt2, pt1, new_matrix[i] );
        }
            C_gm_2_rotate_point( old_matrix[3], tdata, new_matrix[3] );
    }
/**********/
/* scale  */
/**********/
    else if( iopt == 4 )
    {
        C_ut_dpsub ( 3, old_matrix[3], tdata, dist );
        C_ut_dpmult( 3, tdata[3], dist, dist );
        C_ut_dpadd ( 3, tdata, dist, new_matrix[3] );

C_ut_dpsto( 3, old_matrix[0], new_matrix[0] );
        C_ut_dpsto( 3, old_matrix[1], new_matrix[1] );
        C_ut_dpsto( 3, old_matrix[2], new_matrix[2] );
    }
}

/*===========================================================================
: static void C_gm_2_point_on_plane(A,B,C,D, px,py,pz, x,y,z)
: ...........................................................................
: : by Allen Chen (2/28/90)
```

```
/* .............................................................
 * : find intersecting point of the plane(Ax+By+Cz=D)
 * : and the 3D line (vector(A,B,C) & point(px,py,pz) ).
 * :
 * : Note: the vector of the 3D line has to be the same as
 * :       the normal vector of the plane.
 * .............................................................
 * : input   double   A,B,C,D      plane data
 * :         double   px,py,pz     3D point
 * :
 * : output  double   *x,*y,*z     intersecting point
 */
static void C_gm_2_point_on_plane(A,B,C,D, px,py,pz, x,y,z)
double A,B,C,D;
double px,py,pz;
double *x,*y,*z;
{
   double tvalue;

tvalue = ( D  -  ( A*px + B*py + C*pz ) ) / ( A*A + B*B + C*C );
   *x = px + tvalue * A;
   *y = py + tvalue * B;
   *z = pz + tvalue * C;
}
/*=================================================================
 * : static void C_gm_2_rotate_point( pt1, tdata, pt2 )
 *
 * : find the point after rotation
 *
 * : input   double    pt1[3]      -- 3D point
 * :         double    tdata[7]    -- rotating data: X,Y,Z (Point on Axis)
 * :                                                 A,B,C (Vextor of Axis)
 * :                                                 ANG   (Rotation Angle)
 * : output  double    pt2[3]      -- rotated point
```

```
*/
static void C_gm_2_rotate_point( pt1, tdata, pt2 )
double pt1[];
double tdata[];
double pt2[];
{
        double  ptw[3],ptw2[3];
        double  matrix[4][3];

C_gm_ptxln3( pt1, tdata, ptw );
if( C_ut_dpdist( 3, pt1, ptw ) < UNITS.toler )
{       C_ut_dpsto( 3, pt1, pt2 );
        return;
}

C_ut_dpadd( 3, tdata, &tdata[3], ptw );
C_gm_crtpln( tdata, ptw, pt1, matrix[0] );

C_gm_tran3d( 2, matrix[0], ptw, pt1 );

ptw2[0] = ptw[0];
ptw2[1] = ptw[1] * cos( tdata[6] );
ptw2[2] = ptw[1] * sin( tdata[6] );

C_gm_tran3d( 1, matrix[0], ptw2, pt2 );

}
/*===========================================================
: static C_gm_2_mirror_point( pt1, tdata, pt2 )
:
: find the mirroring point
:
:       input   double          pt1[3]          -- 3D point
:               double          tdata[12]       -- plane data
:       output  double          pt2[3]          -- mirroring point
*/
static void C_gm_2_mirror_point( pt1, tdata, pt2 )
```

```
    double pt1[];
    double tdata[];
    double pt2[];
    {
        double ptw[3],dist[3];

C_gm_ptxpl3( pt1, tdata, ptw );
        C_ut_dpsub( 3, ptw, pt1, dist );
        C_ut_dpadd( 3, ptw, dist, pt2 );
    }
```

```
/****************************************************************
 * [Function Name]
 *       iret = C_gm_trsld3x( iopt, mtrx, ptr )
 *
 * [Category]
 *       Geometry Calculation
 *
 * [Description]
 *       Convert 3D Ruled Surface
 *
 * [Parameters]
 *       (i) short    iopt       -- Processing Option
 *                                  1: Local (mtrx) ==> Absolute
 *                                  2: Absolute ==> Local (mtrx)
 *
 *       (i) double   mtrx[4][3] -  matrix of coordinate convention
 *
 *       (i/o) short  ptr[2]     --- pointer to Solid model block
 *
 *       (o) short    iret       -- Return code (0:OK,1:NG)
 *
 * [External Variables]
 *
 * [Calls]
```

```
*   [Restriction]
*
*   [Algorithm]
*
****************************************************************
*
*   Created by   .....   Allen Chen
*          Date   .....   10/23/90
*
****************************************************************
*
*   Modified by  .....
*          Date  .....
*        Nature(#1) .....
*
****************************************************************
*/ short  C_gm_trsld3x( iopt, mtrx, ptr )
short  iopt,ptr[];
double mtrx[];
{
    char   sname[128];
    short  fid,stype;
    short  ftype;
    short  iret;
    short  i;
    short  ihdata[10];
    double D;
    double DD;
    double pn[3], pnn[3];

struct PFaces   *PFaces;
    struct Comphd   *CompList;
    struct SolidTable *Solid;
```

```
PFaces = (struct PFaces *) malloc (sizeof (struct PFaces));
if (PFaces == 0) return 200;
CompList = (struct Comphd *) malloc (sizeof(struct Comphd));
if (CompList == 0)
   {
   free(PFaces);
   return 200;
   }
Solid = (struct SolidTable *) malloc (sizeof(struct SolidTable));
if (Solid == 0)
   {
   free(PFaces);
   free(CompList);
   return 200;
   }

Retv_Solid( ptr, PFaces, CompList, sname );
for( fid=1; fid<=PFaces->NumberFaces; fid++ )
   {
   ftype = PFaces->Face[fid]->FaceType;
   if( ftype == 1 )
      {
      /*..................................................
      : Allen Chen 10/9/90
      : offset faces shall be scaled with scaling value
      :..................................................
      */
      Q_subtype( PFaces, fid, &stype );
      if( stype == 0 )
         {
         Q_Plane_ABCD( PFaces, fid, &pn[0], &pn[1], &pn[2], &D );

iret = C_trplnorm( iopt, mtrx, pn, D, pnn, &DD );

PFaces->Face[fid]->OrgPlane.A = pnn[0];
```

```
            PFaces->Face[fid]->OrgPlane.B = pmn[1];
            PFaces->Face[fid]->OrgPlane.C = pmn[2];
            PFaces->Face[fid]->OrgPlane.D = DD;
        } if (iopt == 1 )
        {
            for( i=1; i<=PFaces->NumberMatrix; i++ )
                iret = C_trmxab ( mtrx, PFaces->Matrix[i]->pi,
                                  PFaces->Matrix[i]->p2, PFaces->Matrix[i]->p3,
                                  PFaces->Matrix[i]->p4);
        }
        else if (iopt == 2)
        {
            for( i=1; i<=PFaces->NumberMatrix; i++ )
                iret = C_trmxlc ( mtrx, PFaces->Matrix[i]->pi,
                                  PFaces->Matrix[i]->p2, PFaces->Matrix[i]->p3,
                                  PFaces->Matrix[i]->p4);
        } iret = mksolid (PFaces, CompList, Solid);
        if (iret == 0)
            iret = C_mi_sdstore ((short)1, PFaces, CompList, sname, indata, ptr );

C_sd_cpftable(PFaces);
        C_sd_ccompl(CompList);
        FreeSolid (Solid);
        free (Solid);
        free (PFaces);
        free (CompList);
        if (iret != 0) iret = 1;
        return( iret );
    }
```

```
short C_trplnorm( iopt, mtrx, n, D, nn, DD)
short iopt;
double mtrx[];
double n[], D;
double nn[], *DD;
{
    double t;
    double p[3], q[3];

p[0] = D * n[0];
    p[1] = D * n[1];
    p[2] = D * n[2];

if (iopt == 1)
    {
        C_gm_tran3d( 11, mtrx, n, nn);
        C_gm_tran3d(  1, mtrx, p, q);
    }
    else if (iopt == 2)
    {
        C_gm_tran3d( 12, mtrx, nn, n);
        C_gm_tran3d(  2, mtrx, q, p);
    } t = sqrt(nn[0]*nn[0] + nn[1]*nn[1] + nn[2]*nn[2]);
    if (t < 1.e-6) return 1;
    else if (fabs(t-1.0) > 1.e-6)
    {
        nn[0] /= t;
        nn[1] /= t;
        nn[2] /= t;
    }

*DD = nn[0]*q[0] + nn[1]*q[1] + nn[2]*q[2];
```

```
    return 0;
} short C_trmxab ( mtrx, p1, p2, p3, p4)
double mtrx[];
double p1[],p2[],p3[],p4[];
{
    double v[3], o[3], tv[3],len;

C_gm_tran3d( 1, mtrx, p4, o);

v[0] = p1[0] + p4[0];
    v[1] = p1[1] + p4[1];
    v[2] = p1[2] + p4[2];
    C_gm_tran3d( 1, mtrx, v, tv);
    tv[0] -= o[0];
    tv[1] -= o[1];
    tv[2] -= o[2];
    len = sqrt(tv[0]*tv[0] + tv[1]*tv[1] + tv[2]*tv[2]);
    p1[0] = tv[0]/len;
    p1[1] = tv[1]/len;
    p1[2] = tv[2]/len;
    v[0] = p2[0] + p4[0];
    v[1] = p2[1] + p4[1];
    v[2] = p2[2] + p4[2];
    C_gm_tran3d( 1, mtrx, v, tv);
    tv[0] -= o[0];
    tv[1] -= o[1];
    tv[2] -= o[2];
    len = sqrt(tv[0]*tv[0] + tv[1]*tv[1] + tv[2]*tv[2]);
    p2[0] = tv[0]/len;
    p2[1] = tv[1]/len;
    p2[2] = tv[2]/len;

v[0] = p3[0] + p4[0];
    v[1] = p3[1] + p4[1];
```

```
    v[2] = p3[2] + p4[2];
    C_gm_tran3d( 1, mtrx, v, tv);
    tv[0] -= o[0];
    tv[1] -= o[1];
    tv[2] -= o[2];
    len = sqrt(tv[0]*tv[0] + tv[1]*tv[1] + tv[2]*tv[2]);
    p3[0] = tv[0]/len;
    p3[1] = tv[1]/len;
    p3[2] = tv[2]/len;

C_ut_dpsto ( 3, o, p4);
    return 0;
} short C_trmxlc ( mtrx, p1, p2, p3, p4)
double mtrx[];
double p1[],p2[],p3[],p4[];
{
    double v[3], tv[3], o[3],len;

C_gm_tran3d( 2, mtrx, o, p4);
    v[0] = p1[0] + p4[0];
    v[1] = p1[1] + p4[1];
    v[2] = p1[2] + p4[2];
    C_gm_tran3d( 2, mtrx, tv, v);
    tv[0] -= o[0];
    tv[1] -= o[1];
    tv[2] -= o[2];
    len = sqrt(tv[0]*tv[0] + tv[1]*tv[1] + tv[2]*tv[2]);
    p1[0] = tv[0]/len;
    p1[1] = tv[1]/len;
    p1[2] = tv[2]/len;

v[0] = p2[0] + p4[0];
    v[1] = p2[1] + p4[1];
```

```
    v[2] = p2[2] + p4[2];
    C_gm_tran3d( 2, mtrx, tv, v);
    tv[0] -= o[0];
    tv[1] -= o[1];
    tv[2] -= o[2];
    len = sqrt(tv[0]*tv[0] + tv[1]*tv[1] + tv[2]*tv[2]);
    p2[0] = tv[0]/len;
    p2[1] = tv[1]/len;
    p2[2] = tv[2]/len;

v[0] = p3[0] + p4[0];
    v[1] = p3[1] + p4[1];
    v[2] = p3[2] + p4[2];
    C_gm_tran3d( 2, mtrx, tv, v);
    tv[0] -= o[0];
    tv[1] -= o[1];
    tv[2] -= o[2];
    len = sqrt(tv[0]*tv[0] + tv[1]*tv[1] + tv[2]*tv[2]);
    p3[0] = tv[0]/len;
    p3[1] = tv[1]/len;
    p3[2] = tv[2]/len;

C_ut_dpsto ( 3, o, p4);
    return 0;
}
```

APPENDIX 6:
```
/******************************************
 *                                          *
 *   HEADER FILE FOR MICRO CADAM WRITTEN C LANGUAGE   *
 *                                          *
 ********************************************************************
 *                                          *
 *   HEADER FILE NAME: PARAM.H              *
 *                                          *
 ********************************************************************
 *                                          *
 *   IDENTIFICATION:                        *
 *                                          *
 *       AUTHOR ......... Frank Niu         *
 *       DATE   ......... 10/15/89          *
 *                                          *
 *       MODIFIED ....... Allen Chen        *
 *       DATE   ......... 4/16/90           *
 *       NATURE ......... Add Spline        *
 *                                          *
 *       MODIFIED .......                   *
 *       DATE   .........                   *
 *       NATURE .........                   *
 *                                          *
 ********************************************************************
 *                                          *
 *   NOTE ON USE:                           *
 *                                          *
 ******************************************/ define  SSIZE  20
define  LSIZE  400
#define  ESIZE  600
#define  VSIZE  600
#define  BSIZE  50
```

```
define  CHLDSZ 100 define  SD_LINE    1
define  SD_CIRCLE  2
define  SD_SPLINE  4 define  F0  0.4142136
define  F1  0.5857864 struct LOOP_LIST
{
    short      EdgeIndex;
    struct     LOOP_LIST  *back, *next;
    struct     LOOP_LIST  *link;
    short      used;
};

struct VertexTable
{
    short   f1, f2, f3;
    double  x, y, z;
};

struct LINE
{
    short  StartVertex;
    short  EndVertex;
};

struct CIRCLE
{
    short   fid;
    short   StartVertex;
    short   EndVertex;
    double  A1, A2;
    struct  POINT *Vertics[13];
```

```
};

struct  SPLINE
        {
        short   fid;            /* face number */
        short   StartVertex;
        short   EndVertex;
        struct  BSPLINE Bspl;
        };

struct  EdgeTable
        {
        short   LeftLoop;
        short   RightLoop;
        short   EdgeType;
        struct  LINE    *Line;
        struct  CIRCLE  *Circle;
        struct  SPLINE  *Spline;
        };

struct  LoopTable
        {
        short   FaceIndex;
        short   NumberEdges;
        struct  LOOP_LIST *ListHead;
        struct  LOOP_LIST *ListPtr;
        short   DividingLoopEdge;
        struct  LoopTable *Ploop;
        struct  LoopTable *Cloop;
        };

struct  SolidTable
        {
        char    name[40];
        short   NumberLoops;
        short   NumberEdges;
```

```c
    short   NumberVertics;
    struct  LoopTable    *LoopTable   [LSIZE];
    struct  EdgeTable    *EdgeTable   [ESIZE];
    struct  VertexTable  *VertexTable[VSIZE];
};
/****************************************************************/
/*                                                              */
/*                         hole.h                              */
/*                                                              */
/****************************************************************/ struct POLYNODE
{
    float   x,y,z;
    short   Show_Edge;
    struct  POLYNODE *next, *back;
};

struct POLYGON_AND_BOX
{
    struct  POLYNODE *header, *ptr;
    float   Xmin, Xmax, Ymin, Ymax, Zmin, Zmax;
};

struct POLYGONS
{
    struct  POLYGON_AND_BOX  *Parent;
    short   NumberChildren;
    struct  POLYGON_AND_BOX  *Children[CHLDSZ];
};

struct INTERSECTION
{
    struct  POLYNODE  *NodePtr;
    short   PolyIndex;
};
```

Page 40

SA9-90-085

APPENDIX 7:
```
/****************************************************************
 *                                                              **
 *   Function name  : Build_xxxxxx_Color_Map ()                 **
 *                                                              **
 *   Category       : COLOR MAP MANAGEMENT                      **
 *                                                              **
 *   Description    : Three major routines set up the color map **
 *                    for three shading modes.                  **
 *                                                              **
 *   Input          : --                                        **
 *                    --                                        **
 *   Output         : --                                        **
 *                    --                                        **
 *   Input/Output   : --                                        **
 *                    --                                        **
 *   Function returns :                                         **
 *                                                              **
 *   Identification :                                           **
```

```
*                                                                   *
*   AUTHOR ............ Chris Chen                                  *
*   DATE .............. 04/12/90                                    *
*                                                                   *
*   MODIFIED BY ....... Allen Chen                                  *
*   DATE .............. 04/27/90                                    *
*   NATURE (#1)........ modify cai_indices                          *
*                                                                   *
*********************************************************************
*                                                                   *
*   Calls       :  -                                                *
*                                                                   *
*********************************************************************
*                                                                   *
*   Called by   :  -                                                *
*                                                                   *
*********************************************************************
*                                                                   *
*   Algorithm   :  Color map has been devided into three            *
*                  different sections, CADAM MAP, USERS MAP,        *
*                  and SHADE MAP.  Their sizes are defined          *
*                  in file "shade.h".                               *
*                  CADAM MAP contains the RGB values of 16          *
*                  CADAM colors.                                    *
*                                                                   *
*                  USERS MAP stores the RGB values of those         *
*                  colors used by button, window, icon, and         *
*                  text.  Currently, 16 entries are allocated       *
*                  for USERS MAP.                                   *
*                                                                   *
*                  SHADE MAP includes 216 entries which are         *
*                  the shading colors for surface display.          *
*                                                                   *
*                  In Dither shading mode, 216 "fixed colors"       *
*                  are reserved for HOOPS standard shading.         *
*                                                                   *
*                  In Constant shading mode, 216 colors are         *
```

```
*   separated into 12 sections for the default   *
*   color and 11 CADAM object colors.  Each      *
*   section contains 18 shade levels of the      *
*   standard colors.                             *
*                                                *
*   In Smooth shading mode, all colors are       *
*   the different shade level of the selected    *
*   shading color (first entry of USERS MAP).    *
* * * * * * * * * * * * * * * * * * * * * * * * **
*                                                *
*   Glossary        :      -------               *
*                          -------               *
*                                                *
* * * * * * * * * * * * * * * * * * * * * * * * **
*                                                *
*   Notes on use    :                            *
*   Normally, two colors are reserved for the    *
*   display of mouse cursor, so the total        *
*   number of the available color is 254.        *
*   These colors can be classified into three    *
*   catagories :                                 *
*                                                *
*   The "regular color" is genererated by the    *
*   use of Set_Color_By_Value routines.  Each    *
*   color of different RGB value occupy one      *
*   entry on the hardware color lookup table,    *
*   and their value can not be changed or        *
*   delete by any HOOPS routine.                 *
*                                                *
*   The "fixed color" is used by the HOOPS to    *
*   generate the dither shading.                 *
*                                                *
*   The "map color" is stored in the virtual     *
*   color map of each segment.  Its RGB value    *
*   can be changed by the programmer.            *
```

```
/****************************************************************
 *                                                               *
 *                                                               *
 *                  Due to the arrangement of the color map,     *
 *                  there is only one shading mode can exist     *
 *                  at any time.                                 *
 *                                                               *
 ****************************************************************/ include <stdio.h>
include <math.h>
#include "constd.h"
#include "color.h"
#include "shade.h"
#include "mltwdw.h"

/*--------------------------------------------------------------*/
/*                                                              */
/*       RGB color value for 64 EGA emulation colors            */
/*                                                              */
/*--------------------------------------------------------------*/ short color_table[64][3] =
{
  {  0, 0, 0},{ 0, 0, 66},{ 0, 0, 0},{ 0, 66, 0},{ 0, 66, 66},{66, 0, 0},{66, 0, 66},{66, 66, 0},{66, 66, 66},
  {  0, 0, 33},{ 0, 0, 99},{ 0, 66, 33},{ 0, 66, 99},{66, 0, 33},{66, 0, 99},{66, 66, 33},{66, 66, 99},
  {  0, 33, 0},{ 0, 33, 66},{ 0, 99, 0},{ 0, 99, 66},{66, 33, 0},{66, 33, 66},{66, 99, 0},{66, 99, 66},
  {  0, 33, 33},{ 0, 33, 99},{ 0, 99, 33},{ 0, 99, 99},{66, 33, 33},{66, 33, 99},{66, 99, 33},{66, 99, 99},
  { 33, 0, 0},{33, 0, 66},{33, 66, 0},{33, 66, 66},{99, 0, 0},{99, 0, 66},{99, 66, 0},{99, 66, 66},
  { 33, 0, 33},{33, 0, 99},{33, 66, 33},{33, 66, 99},{99, 0, 33},{99, 0, 99},{99, 66, 33},{99, 66, 99},
  { 33, 33, 0},{33, 33, 66},{33, 99, 0},{33, 99, 66},{99, 33, 0},{99, 33, 66},{99, 99, 0},{99, 99, 66},
  { 33, 33, 33},{33, 33, 99},{33, 99, 33},{33, 99, 99},{99, 33, 33},{99, 33, 99},{99, 99, 33},{99, 99, 99}
};
```

```
RGB     Color_Map[COLOR_MAP_SIZE];

void    MC_Build_Color_Map ();
void    Show_Color_By_RGB (short index, short *R, short *G, short *B);
void    Show_Color_By_Value (short index, short *value);
void    Set_Color_By_RGB (short index, short R, short G, short B);
void    Set_Color_By_Value (short index, short value);

static void  Build_Normal_Color_Map ();
static void  Build_Dither_Color_Map ();
static void  Build_Constant_Color_Map ();
static void  Build_Gouraud_Color_Map ();
static void  Set_Cadam_Color_Map ();
static void  Set_Users_Color_Map ();

/*----------------------------------------------------------------*/
/*                                                                */
/*     Initialize_Color_Map : Initialize color map.               */
/*                                                                */
/*----------------------------------------------------------------*/
void Initialize_Color_Map (short level)
{
    switch (level)
    {
        case 0 : COLOR.clmod    = 0;        /* Modal color number */
                 COLOR.clcur    = 1;        /* Current color number on side bar */ case 1 : COLOR.clmct[0] = 63;
                 COLOR.clmct[1] = 26;
                 COLOR.clmct[2] = 63;
                 COLOR.clmct[3] = 0;
                 COLOR.clmct[4] = 0;
                 COLOR.clmct[5] = 18;
                 COLOR.clmct[6] = 27;
```

```
            COLOR.clmct[7]  = 36;
            COLOR.clmct[8]  = 54;
            COLOR.clmct[9]  = 37;
            COLOR.clmct[10] = 26;
            COLOR.clmct[11] = 60;
            COLOR.clmct[12] = 52;
            COLOR.clmct[13] = 25;
            COLOR.clmct[14] =  9;
            COLOR.clmct[15] = 40;

case 2 :  COLOR.cldef[0]  = COLOR.clmct[0];      /* DEFAULT COLOR    */
            COLOR.cldef[1]  = 0;
            COLOR.clbrt[0]  = COLOR.clmct[1];      /* BRIGHT  COLOR    */
            COLOR.clbrt[1]  = 1;
            COLOR.clcsr[0]  = COLOR.clmct[2];      /* CURSOR COLOR     */
            COLOR.clcsr[1]  = 2;
            COLOR.clblk[0]  = COLOR.clmct[3];      /* MESSAGE BACKGROUND */
            COLOR.clblk[1]  = 3;
            COLOR.clbgr[0]  = COLOR.clmct[4];      /* MODEL BACKGROUND   */
            COLOR.clbgr[1]  = 4;

COLOR.clshd     = 57;                  /* SHADING COLOR    */

}

Set_Cadam_Color_Map ();
  Set_Users_Color_Map ();
  MC_Build_Color_Map ();
}

/*--------------------------------------------------------------------------*/
/*                                                                          */
/*  Show_Color_By_RGB : Inquire color RGB value of a color index.           */
/*                                                                          */
/*--------------------------------------------------------------------------*/
```

```c
void Show_Color_By_RGB (short index, short *R, short *G, short *B)
{
   *R = color_table[COLOR.clmct[index]][0];
   *G = color_table[COLOR.clmct[index]][1];
   *B = color_table[COLOR.clmct[index]][2];
}
/*-----------------------------------------------------------*/
/*                                                           */
/* Show_Color_By_Value : Inquire color value of a color index. */
/*                                                           */
/*-----------------------------------------------------------*/
void Show_Color_By_Value (short index, short *value)
{
   if (index == 16) *value = COLOR.clshd;
   else             *value = COLOR.clmct[index];
}
/*-----------------------------------------------------------*/
/*                                                           */
/* Set_Color_By_RGB : Modify color RGB value of a color index. */
/*                                                           */
/*-----------------------------------------------------------*/
void Set_Color_By_RGB (short index, short R, short G, short B)
{
   color_table[COLOR.clmct[index]][0] = R;
   color_table[COLOR.clmct[index]][1] = G;
   color_table[COLOR.clmct[index]][2] = B;
}
/*-----------------------------------------------------------*/
/*                                                           */
/* Set_Color_By_Value : Modify color value of a color index.  */
```

```c
/*                                                                          */
/*--------------------------------------------------------------------------*/
void Set_Color_By_Value (short index, short value)
{
if (index == 16) COLOR.clshd = value;
else             COLOR.clmct[index] = value;

Color_Map[CADAM_MAP0+index].R = color_table[value][0] / 99.0;
Color_Map[CADAM_MAP0+index].G = color_table[value][1] / 99.0;
Color_Map[CADAM_MAP0+index].B = color_table[value][2] / 99.0;

HC_QModify_Color_Map_By_Value ("?picture", (int)index, "RGB",
                               (int)1, &Color_Map[index].R);

switch (SHADE.mode)
{
    case -1: break;
    case  0: break;
    case  1: break;
    case  2: if (index > 4) Build_Constant_Color_Map ();
             break;
    case  3: if (index == 16) Build_Gouraud_Color_Map ();
             break;
    default: /* do nothing */;
}
}

/*                                                                          */
/*--------------------------------------------------------------------------*/
/*  MC_Build_Color_Map () : Build color map for any shading condition       */
/*--------------------------------------------------------------------------*/
void MC_Build_Color_Map ()
{
    switch (SHADE.mode)
```

```
        {
        case -1:
        case  0:  Build_Normal_Color_Map ();
                  break;
        case  1:  Build_Dither_Color_Map ();
                  break;
        case  2:  Build_Constant_Color_Map ();
                  break;
        case  3:  Build_Gouraud_Color_Map ();
                  break;
        default: /* do nothing */;
        }

/*----------------------------------------------------------------*/
/*                                                                */
/*  Build_Normal_Color_Map : Set up normal wireframe color map.   */
/*                                                                */
/*----------------------------------------------------------------*/ static void Build_Normal_Color_Map ()
{
if (COLOR.cldpf <= 16)
    {
    HC_Open_Segment ("?picture");
        HC_UnSet_Color_Map ();
        HC_Set_Driver_Options ("fixed colors = 0");
        HC_Set_Color_Map_By_Value ("RGB", CADAM_MAP_SIZE, Color_Map);
    HC_Close_Segment();
    }
else
    {
    HC_Open_Segment ("?picture");
        HC_UnSet_Color_Map ();
        HC_Set_Color_Map_By_Value ("RGB", BASIC_MAP_SIZE, Color_Map);
#ifdef NTH
```

```
                HC_Set_Driver_Options ("fixed colors = 125");
#else
                HC_Set_Driver_Options ("fixed colors = 216");
#endif
                HC_Close_Segment();
        }

/*--------------------------------------------------------------*/
/*                                                              */
/*  Build_Dither_Color_Map : Set up dither shading mode color map. */
/*                                                              */
/*--------------------------------------------------------------*/ static void Build_Dither_Color_Map ()
{
        if (COLOR.cldpf <= 16)
        {
                HC_Open_Segment ("?picture");
                HC_UnSet_Color_Map ();
                HC_Set_Color_Map_By_Value ("RGB", COLOR.cldpf-8, Color_Map);
                HC_Set_Driver_Options ("fixed colors = 8");
                HC_Close_Segment();
        }
        else
        {
                HC_Open_Segment ("?picture");
                HC_UnSet_Color_Map ();
                HC_Set_Color_Map_By_Value ("RGB", BASIC_MAP_SIZE, Color_Map);
#ifdef NTH
                HC_Set_Driver_Options ("fixed colors = 125");
#else
                HC_Set_Driver_Options ("fixed colors = 216");
#endif
                HC_Close_Segment();
```

```
}
/*--------------------------------------------------------------*/
/*                                                              */
/*      Build_Constant_Color_Map : Set up constant shading color map.    */
/*                                                              */
/*--------------------------------------------------------------*/
static void Build_Constant_Color_Map ()
{
    short i, j, k, lstart, index;
    float x;

if (COLOR.cldpf <= 16) return;

/*..............................................................
      : by A. Chen
      :
      : MAXLEV : The maximum number of gray level.
      :          This value is defined in file "shade.h"
      : LEVEL  : number of gray levels to be used for fine shading
      :
      ..............................................................*/

/* Calculate gray level for default & 11 CADAM colors */
    lstart = MAXLEV - LEVEL;
    for (i = 0; i <= 11; i++)
    {
        if (i == 0) index = COLOR.cldef[0];
        else        index = COLOR.clmct[i+4];

for (j = SHADE_MAP0 + i*LEVEL, k = 0; k < LEVEL; j++, k++)
        {
            x = 0.01 * (lstart + k) / MAXLEV;
```

Page 51

```
            Color_Map[j].R = color_table[index][0] * x;
            Color_Map[j].G = color_table[index][1] * x;
            Color_Map[j].B = color_table[index][2] * x;
    }

HC_Open_Segment ("?picture");
        HC_UnSet_Color_Map ();
        HC_Set_Driver_Options ("fixed colors = 0");
        HC_Set_Color_Map_By_Value ("RGB", COLOR_MAP_SIZE, Color_Map);
    HC_Close_Segment();
}

/*--------------------------------------------------------------*/
/*                                                              */
/*      Build_Gouraud_Color_Map : Set up Gouraud shading mode color map.    */
/*                                                              */
/*--------------------------------------------------------------*/ static void Build_Gouraud_Color_Map ()
{
    short i;
    RGB    Camb, M;
    float  pai, Rstep, Gstep, Bstep;
    float  cosa[GOURAUD_COLOR_SIZE];
    float  PI = 3.1415926;
    float  range;
    float  amb;

if (COLOR.cldpf <= 16) return;

/*.............................................................
 : Allen Chen, 4/25/90
 : amb : ambient factor will be referenced as a
 : global variable which can be defined by users.
 : The factor makes the range of gouraud color map
```

```
: run between amb and 1.0. It discards the colors
: under amb and gives more gray leves to visible
: range.
: if amb is defined as global variable then the
: color map will range from amb to somewhere close
: to 1.0. Thus, the routine calculate_indices()
: shall be rewritten to produce correct indices.
: For now, the value of amb is set to 0.0.
:.............................................................
*/ amb = 0.0;
range = (float)((GOURAUD_COLOR_SIZE - 1) * (short)100);
pai = (float)(PI_D / (double)((short)GOURAUD_COLOR_SIZE * (short)2));

for (i= 0; i < GOURAUD_COLOR_SIZE; i++)
    cosa[GOURAUD_COLOR_SIZE-1-i] = pow (cos (i*pai), 5);
/*
: Allen Chen, 4/25/90
: find ambient color of RGB.
: RGB step is adjusted by ambient color
:.............................................................
*/
Camb.R = color_table[COLOR.clshd][0] * amb;
Camb.G = color_table[COLOR.clshd][1] * amb;
Camb.B = color_table[COLOR.clshd][2] * amb;

Rstep = (color_table[COLOR.clshd][0] - Camb.R) / range;
Gstep = (color_table[COLOR.clshd][1] - Camb.G) / range;
Bstep = (color_table[COLOR.clshd][2] - Camb.B) / range;

for (i = 0; i < GOURAUD_COLOR_SIZE; i++)
{
    M.R = i * Rstep + Camb.R;
    M.G = i * Gstep + Camb.G;
    M.B = i * Bstep + Camb.B;
```

```c
                Color_Map[SHADE_MAP0 + i].R = M.R + (1-M.R) * cosa[i] * 0.5;
                Color_Map[SHADE_MAP0 + i].G = M.G + (1-M.G) * cosa[i] * 0.5;
                Color_Map[SHADE_MAP0 + i].B = M.B + (1-M.B) * cosa[i] * 0.5;
#ifdef DEBUG
                printf("colormap[%d]=(%lf,%lf,%lf)\n", COLOR_MAP_SIZE-1-i,
                        Color_Map[SHADE_MAP0 + i].R,
                        Color_Map[SHADE_MAP0 + i].G,
                        Color_Map[SHADE_MAP0 + i].B);
#endif
        }

HC_Open_Segment ("?picture");
        HC_UnSet_Color_Map ();
        HC_Set_Driver_Options ("fixed colors = 0");
        HC_Set_Color_Map_By_Value ("RGB", COLOR_MAP_SIZE, Color_Map);
        HC_Close_Segment();
}

/*--------------------------------------------------------------------*/
/*                                                                    */
/*      Set_Cadam_Color_Map : Set sixteen CADAM basic color map.      */
/*                                                                    */
/*--------------------------------------------------------------------*/
static void Set_Cadam_Color_Map ()
{
        short i;

for (i = 0; i < CADAM_MAP_SIZE; i++)
        {
                Color_Map[CADAM_MAP0+i].R = color_table[COLOR.clmct[i]][0] / 99.0;
                Color_Map[CADAM_MAP0+i].G = color_table[COLOR.clmct[i]][1] / 99.0;
                Color_Map[CADAM_MAP0+i].B = color_table[COLOR.clmct[i]][2] / 99.0;
        }
}
```

```
/*--------------------------------------------------------------*/
/*                                                              */
/*  Set_Users_Color_Map : Set user shading color map.           */
/*                                                              */
/*--------------------------------------------------------------*/
static void Set_Users_Color_Map ()
{
    short i;
    float gray;
    RGB   white, brite;

Color_Map[USERS_MAP0].R = color_table[COLOR.clshd][0] / 99.0;
    Color_Map[USERS_MAP0].G = color_table[COLOR.clshd][1] / 99.0;
    Color_Map[USERS_MAP0].B = color_table[COLOR.clshd][2] / 99.0;

/* set 5 gray shades */
    white.R = 0.75;
    white.G = 1.0;
    white.B = 1.0;
    brite.R = color_table[COLOR.clbrt[0]][0] / 99.0;
    brite.G = color_table[COLOR.clbrt[0]][1] / 99.0;
    brite.B = color_table[COLOR.clbrt[0]][2] / 99.0;
    for (i = 1; i <= 5; i++)
    {
        switch (i)
        {
            case 1: gray = 0.125; break;
            case 2: gray = 0.195; break;
            case 3: gray = 0.306; break;
            case 4: gray = 0.479; break;
            case 5: gray = 0.75;  break;
        }
        Color_Map[USERS_MAP0+i].R = white.R * gray;
        Color_Map[USERS_MAP0+i].G = white.G * gray;
```

```
Color_Map[USERS_MAP0+i].B = white.B * gray;
Color_Map[USERS_MAP0+5+i].R = brite.R * gray;
Color_Map[USERS_MAP0+5+i].G = brite.G * gray;
Color_Map[USERS_MAP0+5+i].B = brite.B * gray;
}
for (i = USERS_MAP0+11; i < USERS_MAP_SIZE; i++)
{
    Color_Map[USERS_MAP0+i].R = 1.0;
    Color_Map[USERS_MAP0+i].G = 1.0;
    Color_Map[USERS_MAP0+i].B = 1.0;
}
```

```
APPENDIX 8:
/****************************************************************
 *                                                               *
 *                    Calculate Indices                          *
 *                                                               *
 *---------------------------------------------------------------*
 *                                                               *
 * The routine returns the index to the color map for the given Normal *
 * and my_lights[4].                                             *
 *                                                               *
 * eye vector: come form window matrix (zvector)                 *
 * light vector: was transformed form world system to window system (active)*
 *                                                               *
 *---------------------------------------------------------------*
 *                                                               *
 * Author    : Allen Chen                                        *
 *                                                               *
 *                                                               *
 ****************************************************************/ void calculate_indices( Normal, my_lights, index )
double  Normal[];
VECTOR  my_lights[4];
short   *index;

{
    VECTOR eye, refraction, norm;
    float  amb, difus;
    float  t1, t2, coso, cosa, cosr,ta;

float  max_color;
    short  light_num;
```

```
float range;
/*
 .................
 .................
 */
range  = (float) (GOURAUD_COLOR_SIZE - 1);
amb    = 0.1;
difus  = 0.5;

eye.x = WDW3D.wzvec[0];
eye.y = WDW3D.wzvec[1];
eye.z = WDW3D.wzvec[2];
norm.x = (float) Normal[0];
norm.y = (float) Normal[1];
norm.z = (float) Normal[2];

dot_vectors ( &cosr, eye, norm );
if( cosr <= 1.e-3) cosr = 0.0;

max_color = 0.0;
for ( light_num=0; light_num< 4; light_num++)
{
    if( SHADE.light[light_num] == ON )
    {
        coso = my_lights[light_num].x*norm.x
             + my_lights[light_num].y*norm.y
             + my_lights[light_num].z*norm.z;

if ((coso <= 0.0 ) || (coso > 1.0)) coso = 0.0;

refraction.x = -my_lights[light_num].x + 2*coso * norm.x;
        refraction.y = -my_lights[light_num].y + 2*coso * norm.y;
        refraction.z = -my_lights[light_num].z + 2*coso * norm.z;
        t1 = sqrt ( refraction.x * refraction.x +
                    refraction.y * refraction.y +
                    refraction.z * refraction.z);
```

```
    refraction.x /= t1;
    refraction.y /= t1;
    refraction.z /= t1;

dot_vectors( &cosa, refraction, eye );

if(((coso > 0.0 ) && (cosa > 0.0) && (cosr > 0.0))
    {
        ta = cosa * cosa;
        cosa = ta*ta*cosa;
    }
    else
    {
        cosa = 0.0;
    } t1 = amb + coso * ( 1.0 - amb ) * difus;  /*ambient + diffuse*/
    t2 = t1 + ( 1.0 - t1 ) * cosa;            /*complement factor */
    }
    else
        t2 = amb;

if( t2 > max_color ) max_color = t2;

*index = (short)SHADE_MAP0 + (short)(max_color * range + (float)0.5);
}
```

```
APPENDIX 9:
/*..................................................................
 : Allen Chen 8/23/90
 :
 : The files include this header
 :-----------------------------------------------------------------
 :
*/ ifndef BSPLINE_H_FILE
    #define BSPLINE_H_FILE define MAXSplineKnots 50
define MAXKnots 56
#define MAXControlPoints 52
#define GLOBAL_TO_LOCAL 1
define LOCAL_TO_GLOBAL 2 struct BSPLINE
{
    /*............................................................
     : A. Chen
     :
     : Attributes
     :   Bclosed       0/open          1/closed
     :   Bperiodic     0/nonperiodic   1/periodic
     :   Brational     0/nonrational   1/rational
     :   Bplanar       0/nonplanar     1/planar
     :
     : Data
     :   Order  : order of the B spline
     :   Nknots : the number of knots in the array KnotSequence[]
     :   Ncp    : the number of control points in ControlPoints[]
     :   Start  : starting knot sequece of the curve (relimit data)
     :   End    : ending knot sequence of the curve (relimit data)
```

```
/* ......................................................
 */
    short   Bclosed;
    short   Bperiodic;
    short   Brational;
    short   Bplanar;
    short   Order;
    short   Nknots;
    short   Ncp;
    double  Start, End;
    double  KnotSequence [MAXKnots];
    struct POINT *ControlPoints [MAXControlPoints];
};

struct SURFACE
{
    short   Udisp, Wdisp;
    short   BUclosed,   BWclosed;
    short   BUperiodic, BWperiodic;
    short   BUrational, BWrational;
    short   Uorder, Worder;
    short   NknotsU, NknotsW;
    double  KnotSequenceU[MAXKnots], KnotSequenceW[MAXKnots];
    struct POINT *ControlPoints[MAXControlPoints][MAXControlPoints];
};

struct RULEDSURFACE
{
    short   Udisp, Wdisp;
    struct BSPLINE  B_Spline1,  B_Spline2;
};

struct ROTATIONAL_SURFACE
{
    double A[3], B[3], C[3], Origin[3];
    double A1, A2;
```

```
    short  Udisp, Wdisp;
    struct BSPLINE  *B_Spline;
};

struct EDGE_SURFACE
{
    short  Udisp, Wdisp;
    struct BSPLINE  B_Spline[4];
};

#endif
```

APPENDIX 10:

```
short C_sf_mormbsf(ptr)
short ptr[];
{
    short   ret;
    short   i,j;
    short   w2,w,j2;
    double  tx,ty,tz;
    struct SURFACE *SkinSurface;

SkinSurface = (struct SURFACE *) malloc (sizeof (struct SURFACE));
    if (SkinSurface == 0) return 200;

ret = ssr_GetSurfaceData( ptr, SkinSurface );
    if( ret == 0 )
    {
        w = SkinSurface->NknotsW-4;
        w2 = w/2;
        for( i=0; i<SkinSurface->NknotsU-4; i++ )
            for( j=0; j<w2; j++ )
            {
                j2 = w-j-1;
                tx = SkinSurface->ControlPoints[i][j]->x;
                ty = SkinSurface->ControlPoints[i][j]->y;
                tz = SkinSurface->ControlPoints[i][j]->z;
                SkinSurface->ControlPoints[i][j]->x = SkinSurface->ControlPoints[i][j2]->x;
                SkinSurface->ControlPoints[i][j]->y = SkinSurface->ControlPoints[i][j2]->y;
                SkinSurface->ControlPoints[i][j]->z = SkinSurface->ControlPoints[i][j2]->z;
                SkinSurface->ControlPoints[i][j2]->x = tx;
                SkinSurface->ControlPoints[i][j2]->y = ty;
                SkinSurface->ControlPoints[i][j2]->z = tz;
            }
        w = SkinSurface->NknotsW;
        w2 = w/2;
```

```
        tz = SkinSurface->KnotSequenceW[w-1];
        for( j=0; j<w2; j++ )
        {
            j2 = w-j-1;
            tx = SkinSurface->KnotSequenceW[j];
            SkinSurface->KnotSequenceW[j] = tz - SkinSurface->KnotSequenceW[j2];
            SkinSurface->KnotSequenceW[j2] = tz - tx;
        }
        if ((w%2) == 1)
            SkinSurface->KnotSequenceW[w2] = tz - SkinSurface->KnotSequenceW[w2];
    }
    C_mi_sfstobsf(((short)SF_REPLC,SkinSurface,ptr);
    free_skincntl(SkinSurface);
}
free(SkinSurface);
return 0;
}
#undef SF_STORE
undef SF_REPLC short C_sf_mnormbnd(ptr)
short ptr[];
{
    short ret;
    struct EDGE_SURFACE *EdgeSurface;

EdgeSurface = (struct EDGE_SURFACE *) malloc (sizeof(struct EDGE_SURFACE));
    if (EdgeSurface == 0) return 200;

ret = getbdrysf(ptr, EdgeSurface);

if (ret == 0)
    {
        bsflip(&EdgeSurface->B_Spline[0]);
        bsflip(&EdgeSurface->B_Spline[1]);
```

```
        ret = swap_bspl(&EdgeSurface->B_Spline[2],&EdgeSurface->B_Spline[3]);
        if (ret != 0) return ret;
        ret = C_mi_sfstobnd ((short)SF_REPLC, EdgeSurface, ptr );
        freeEdgeSurf(EdgeSurface);
    }
    free(EdgeSurface);

return ret;
}
#undef SF_STORE
undef SF_REPLC short C_sf_rnormrul(ptr)
short ptr[];
{
    struct RULEDSURFACE *RuledSurface;
    short  ret;

RuledSurface = (struct RULEDSURFACE *) malloc (sizeof(struct RULEDSURFACE));
    if (RuledSurface == 0) return 200;

ret = getrulsf(ptr, RuledSurface);
    if (ret == 0)
    {
        bsflip(&RuledSurface->B_Spline1);
        bsflip(&RuledSurface->B_Spline2);
        ret = C_mi_sfstorul((short)1, RuledSurface, ptr);

(void) free_CntlPnts(&RuledSurface->B_Spline1);
        (void) free_CntlPnts(&RuledSurface->B_Spline2);
    }
    free(RuledSurface);
    return ret;
}
```

```
short C_sf rnomrot(ptr)
short ptr[];
{
    struct ROTATIONAL_SURFACE *rotsrf;
    short ret;

rotsrf = (struct ROTATIONAL_SURFACE *) malloc (sizeof(struct ROTATIONAL_SURFACE));
    if (rotsrf == 0) return 200;

ret = ssr_GetRotational( ptr, rotsrf );
    if( ret == 0 )
    {
        bsflip(rotsrf->B_Spline);
        ret = C_mi_sfstorev((short)SF_REPLC,rotsrf,ptr);
        free_CntlPnts(rotsrf->B_Spline);
    }
    free(rotsrf);

return ret;
}
```

What is claimed is:

1. Apparatus for performing a set of display operations to modify a three dimensional drawing on a graphic display, comprising:
    (a) means for storing a plurality of planes for defining a three dimensional drawing on a graphic display;
    (b) means for selecting a first plane based on a first aspect of the three dimensional drawing;
    (c) means for defining a variable plane based on a second aspect of the three dimensional drawing;
    (d) means for changing the distance between the first plane and the variable plane;
    (e) means for modifying the drawing to reflect the changed distance; and
    (f) means for defining a plane from a second three dimensional drawing as the variable plane.

2. Apparatus as recited in claim 1, further comprising data structure means for storing three dimensional drawing information.

3. Apparatus as recited in claim 1, further comprising data structure means for storing plane information.

4. Apparatus as recited in claim 1, further comprising means for specifying the location where the drawing should appear on the graphic display.

5. Apparatus as recited in claim 1, further comprising means for making faces of a solid transparent.

6. Apparatus as recited in claim 1, further comprising means for defining two pairs of parallel planes, the parallel planes including first and second parent planes for indicating two fixed faces of the three dimensional drawing and first and second offset planes for indicating two variable faces of the three dimensional drawing, the first parent plane being parallel with the first offset plane, the second parent plane being parallel with the second offset plane.

7. Apparatus for performing a set of display operations to modify a three dimensional drawing on a graphic display, comprising:
    (a) means for storing a plurality of planes for defining a three dimensional drawing on a graphic display;
    (b) means for selecting a first plane based on a first aspect of the three dimensional drawing;
    (c) means for defining a variable plane based on a second aspect of the three dimensional drawing;
    (d) means for changing the distance between the first plane and the variable plane:
    (e) means for modifying the drawing to reflect the changed distance; and
    (f) means for joining two, three dimensional drawings.

8. A method for performing a set of display operations to modify a three dimensional drawing on a graphic display, comprising the steps of:
    (a) storing a plurality of planes for defining a three dimensional drawing on a graphic display;
    (b) defining a first plane based on a first aspect of the three dimensional drawing;
    (c) defining a variable plane based on a second aspect of the three dimensional drawing;
    (d) changing the distance between the first plane and the variable plane;
    (e) modifying the three dimensional drawing to reflect the changed distance; and
    (f) defining a plane from a second three dimensional drawing as the variable plane.

9. A method as recited in claim 8, further comprising the step of creating a data structure to save three dimensional drawing information.

10. A method as recited in claim 8, further comprising storing plane information in a data structure.

11. A method as recited in claim 8, further comprising the step of specifying the location where the drawing should appear on the graphic display.

12. A method as recited in claim 8, further comprising the step of making faces of a solid transparent.

13. A method as recited in claim 8, further comprising the step of defining two pairs of parallel planes, the parallel planes including first and second parent planes for indicating two fixed faces of the three dimensional drawing and first and second offset planes for indicating two variable faces of the three dimensional drawing, the first parent plane being parallel with the first offset plane, the second parent plane being parallel with the second offset plane.

14. A method for performing a set of display operations to modify a three dimensional drawing on a graphic display, comprising the steps of:
    (a) storing a plurality of planes for defining a three dimensional drawing on a graphic display;
    (b) defining a first plane based on a first aspect of the three dimensional drawing;
    (c) defining a variable plane based on a second aspect of the three dimensional drawing;
    (d) changing the distance between the first plane and the variable plane;
    (e) modifying the three dimensional drawing to reflect the changed distance; and
    (f) joining two, three dimensional drawings.

15. A data processing system for modifying an object displayed as a three dimensional drawing on a graphic display, comprising:
    storage means for storing a plurality of planes for defining the object as a three dimensional drawing on a graphic display, wherein the object includes a plurality of faces;
    display means for displaying the object on the graphics display;
    first definition means for defining a first face from one of the plurality of faces;
    selection means for selecting an offset face from the plurality of faces, wherein the offset face is parallel to the first face;
    determination means for determining a distance between the first face and the offset face;
    change means for changing said distance between the first face and the offset face;
    modification means, responsive to the change means, for altering the display of the object on the graphic display, wherein the display of the object is altered to reflect the changed distance; and
    second display means for suppressing display of a selected face of the object being displayed on the graphics display, wherein a face hidden by the selected face is displayed and may be selected for manipulation.

16. The data processing system of claim 15 further comprising third display means for displaying all hidden faces of the object.

17. The data processing system of claim 15 further comprises selection means for selecting a face from a second object as a variable face.

18. A computer program product comprising:
    first instruction means for storing a plurality of planes for defining a three dimensional drawing on a graphic display;

second instruction means for selecting a first plane based on a first aspect of the three dimensional drawing;

third instruction means for defining a variable plane based on a second aspect of the three dimensional drawing;

fourth instruction means for changing the distance between the first plane and the variable plane;

fifth instruction means for modifying the three dimensional drawing to reflect the changed distance; and sixth instruction means for defining a plane from a second three dimensional drawing as the variable plane.

19. A storage device readable by a computer and encoding computer executable instructions for performing a set of display operations to modify a three dimensional drawing on a graphic device, the storage device comprising:

means for storing a plurality of planes for defining a three dimensional drawing on a graphic display;

means for selecting a first plane based on a first aspect of the three dimensional drawing;

means for defining a variable plane based on a second aspect of the three dimensional drawing;

means for changing the distance between the first plane and the variable plane;

means for modifying the three dimensional drawing to reflect the changed distance; and means for defining a plane from a second three dimensional drawing as the variable plane, wherein the means are activated when the storage device is connected to and accessed by the computer.

20. The storage device of claim 19, wherein the storage device is a hard drive.

21. The storage device of claim 19, wherein the storage device is a diskette.

22. The storage device of claim 19, wherein the storage device is a random access memory.

* * * * *